(12) United States Patent
Song et al.

(10) Patent No.: US 11,887,931 B2
(45) Date of Patent: Jan. 30, 2024

(54) SEMICONDUCTOR PACKAGE WITH STEPPED REDISTRIBUTION STRUCTURE EXPOSING MOLD LAYER

(71) Applicant: SAMSUNG ELECTRONICS CO., LTD., Suwon-si (KR)

(72) Inventors: Inhyung Song, Cheonan-si (KR); Kyoung Lim Suk, Suwon-si (KR); Jaegwon Jang, Hwaseong-si (KR); Wonkyoung Choi, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 19 days.

(21) Appl. No.: 17/213,506

(22) Filed: Mar. 26, 2021

(65) Prior Publication Data

US 2022/0068818 A1    Mar. 3, 2022

(30) Foreign Application Priority Data

Aug. 26, 2020 (KR) .................. 10-2020-0107781

(51) Int. Cl.
*H01L 21/768* (2006.01)
*H01L 23/522* (2006.01)
(Continued)

(52) U.S. Cl.
CPC ...... *H01L 23/5384* (2013.01); *H01L 23/3114* (2013.01); *H01L 23/5386* (2013.01); *H01L 24/14* (2013.01)

(58) Field of Classification Search
CPC . H01L 23/5389; H01L 21/56; H01L 23/5386; H01L 24/19; H01L 24/20; H01L 23/544; H01L 21/565; H01L 21/6835; H01L 21/568; H01L 23/3128; H01L 23/5383; H01L 21/4857; H01L 2223/54486; H01L 23/49838; H01L 2221/68318; H01L 23/49816; H01L 2224/92244; H01L 2224/12105; H01L 2221/68345; H01L 2221/68372; H01L 2223/54406; H01L 2224/32225; H01L 2224/214; H01L 24/73; H01L 24/32; B23K 26/355; B23K 26/364; B23K 26/402; B23K 26/352; B23K 2101/40

See application file for complete search history.

(56) References Cited

U.S. PATENT DOCUMENTS

| | | | |
|---|---|---|---|
| 6,680,220 B2 | 1/2004 | Minamio et al. | |
| 8,097,490 B1 * | 1/2012 | Pagaila | H01L 24/97 438/618 |

(Continued)

FOREIGN PATENT DOCUMENTS

KR   10-2016-0001169 A   1/2016

*Primary Examiner* — Marcos D. Pizarro
*Assistant Examiner* — Tenley H Schofield
(74) *Attorney, Agent, or Firm* — Muir Patent Law, PLLC

(57) ABSTRACT

A semiconductor package includes a first semiconductor device on a first redistribution substrate, a first mold layer that covers the first semiconductor device and the first redistribution substrate, and a second redistribution substrate on the first mold layer, the second redistribution substrate including a first opening that exposes a top surface of the first mold layer, a sidewall of the second redistribution substrate that is exposed to the first opening having a stepwise structure.

18 Claims, 19 Drawing Sheets

(51) Int. Cl.
   *H01L 23/00*    (2006.01)
   *H01L 23/31*    (2006.01)
   *H01L 23/495*   (2006.01)
   *H01L 23/528*   (2006.01)
   *H01L 23/532*   (2006.01)
   *H01L 27/08*    (2006.01)
   *H01L 23/538*   (2006.01)

(56) References Cited

U.S. PATENT DOCUMENTS

| | | |
|---|---|---|
| 8,394,676 B2 | 3/2013 | Yamaji |
| 9,343,434 B2 | 5/2016 | Chen |
| 10,096,553 B2 | 10/2018 | Su et al. |
| 10,134,719 B2 | 11/2018 | Cheng et al. |
| 2002/0096767 A1* | 7/2002 | Cote ............... H01L 23/055 |
| | | 257/E23.101 |
| 2012/0217607 A1* | 8/2012 | Hanai ............. H01L 27/1469 |
| | | 438/66 |
| 2015/0235845 A1* | 8/2015 | Sekita ............ H01L 23/3114 |
| | | 438/667 |
| 2015/0380359 A1 | 12/2015 | Lim |
| 2019/0341360 A1 | 11/2019 | Yu et al. |
| 2019/0348370 A1* | 11/2019 | Lin ................ H01L 21/6835 |
| 2020/0035604 A1* | 1/2020 | Rubin ............. H01L 23/055 |
| 2020/0105545 A1* | 4/2020 | Wang ............ H01L 23/49811 |
| 2020/0105665 A1 | 4/2020 | Jeong |
| 2020/0111742 A1 | 4/2020 | Han et al. |
| 2020/0273806 A1* | 8/2020 | Chiang ........... H01L 23/5389 |
| 2020/0381373 A1* | 12/2020 | Lee ................ H01L 23/5389 |

* cited by examiner

SEMICONDUCTOR PACKAGE WITH STEPPED REDISTRIBUTION STRUCTURE EXPOSING MOLD LAYER

CROSS-REFERENCE TO RELATED APPLICATION

Korean Patent Application No. 10-2020-0107781, filed on Aug. 26, 2020, in the Korean Intellectual Property Office, and entitled: "Semiconductor Package and method of Fabricating the Same," is incorporated by reference herein in its entirety.

BACKGROUND

1. Field

Embodiments relate to a semiconductor package and a method of fabricating the same.

2. Description of the Related Art

A semiconductor package is provided to implement an integrated circuit chip to qualify for use in electronic products. A semiconductor package is typically configured such that the semiconductor chip is mounted on a printed circuit board (PCB) and bonding wires or bumps are used to electrically connect the semiconductor chip to the PCB. With the development of electronic industry, many studies have been conducted to improve reliability and durability of semiconductor packages.

SUMMARY

According to some example embodiments, a semiconductor package may include a first semiconductor device on a first redistribution substrate, a first mold layer that covers the first semiconductor device and the first redistribution substrate, and a second redistribution substrate being disposed on the first mold layer and including a first opening that exposes a top surface of the first mold layer. A sidewall of the second redistribution substrate may have a stepwise structure, the sidewall being exposed to the first opening.

According to some example embodiments, a semiconductor package may include a first semiconductor device on a first redistribution substrate, a first mold layer that covers the first semiconductor device and the first redistribution substrate, a second redistribution substrate being disposed on the first mold layer and including a first opening that exposes a top surface of the first mold layer, and a conductive pillar that penetrates the first mold layer and electrically connects the first redistribution substrate to the second redistribution substrate. The second redistribution substrate may include: a first redistribution dielectric layer that contacts the first mold layer and has a first sidewall, a second redistribution dielectric layer on the first redistribution dielectric layer and having a second sidewall spaced apart from the first sidewall, wherein the second redistribution dielectric layer partially exposes a top surface of the first redistribution dielectric layer, and a first redistribution pattern between the first redistribution dielectric layer and the second redistribution dielectric layer, wherein the first redistribution pattern penetrates the first redistribution dielectric layer and has a connection with the conductive pillar. The second redistribution substrate may have a thickness of about 20 μm to about 30 μm.

According to some example embodiments, a semiconductor package may include a first semiconductor device on a first redistribution substrate, a first mold layer that covers the first semiconductor device and the first redistribution substrate, and a second redistribution substrate being disposed on the first mold layer and having a first opening that exposes a top surface of the first mold layer. The second redistribution substrate may include a first redistribution dielectric layer and a second redistribution dielectric layer that are sequentially stacked. A thickness of the first redistribution dielectric layer may be less than a thickness of the second redistribution dielectric layer.

According to some example embodiments, a method of fabricating a semiconductor package may include bonding a conductive pillar and a first semiconductor device to a first substrate, forming a first mold layer that covers the conductive pillar and the first semiconductor device and includes a marking area, coating a first redistribution dielectric layer on the first mold layer, patterning the first redistribution dielectric layer to form a first via hole that exposes the conductive pillar and a first opening that exposes the marking area, forming a first redistribution pattern that fills the first via hole and protrudes onto the first redistribution dielectric layer, coating a second redistribution dielectric layer on the first redistribution dielectric layer, and patterning the second redistribution dielectric layer to form a second via hole that exposes the first redistribution pattern and a second opening that exposes the marking area.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
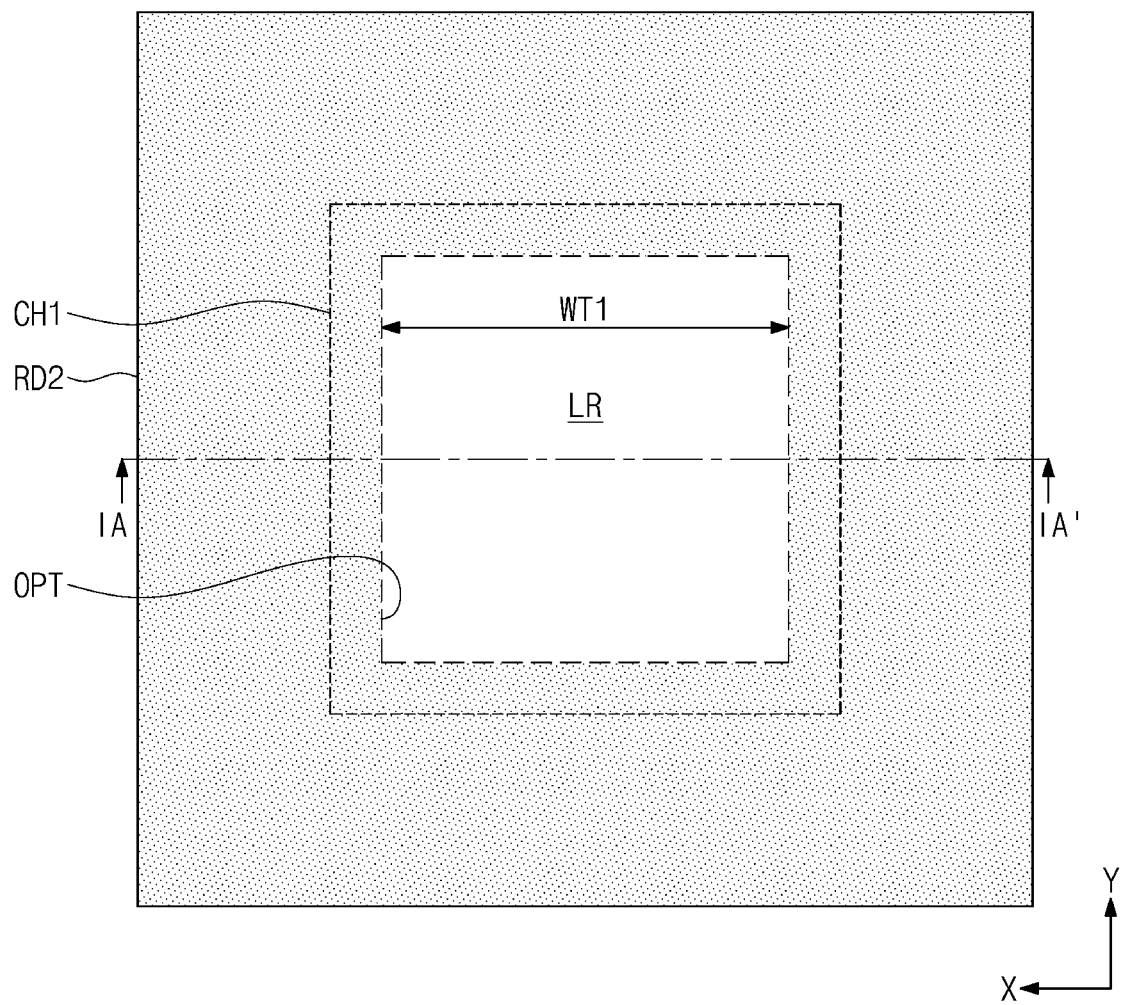
FIG. 1 illustrates a plan view of a semiconductor package according to some example embodiments.
Figure 2:
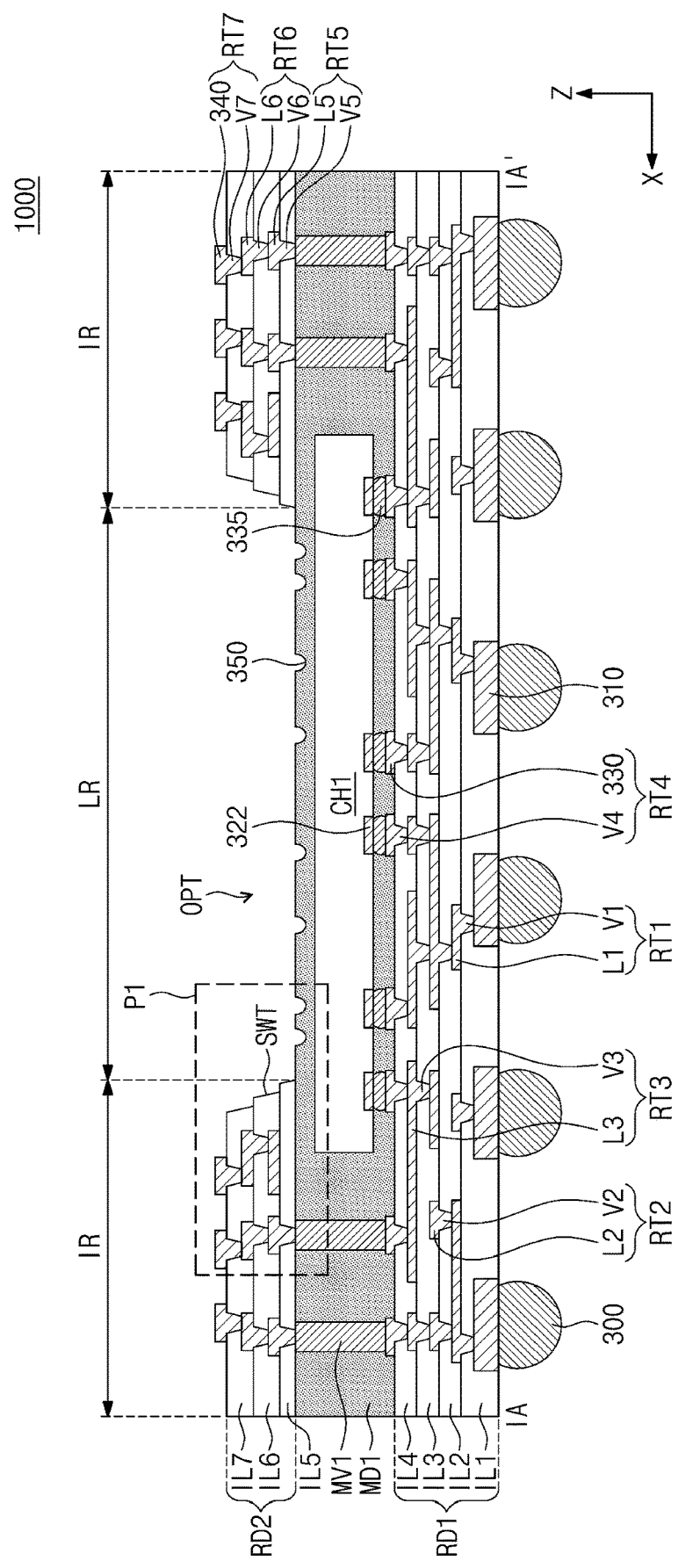
FIG. 2 illustrates a cross-sectional view taken along line IA-IA' of FIG. 1, according to some example embodiments.

FIG. 1 illustrates a plan view of a semiconductor package according to example embodiments. FIG. 2 illustrates a cross-sectional view along line IA-IA' of FIG. 1.

Referring to FIGS. 1 and 2, a semiconductor package 1000 according to the present embodiment may include a first redistribution substrate RD1 and a first semiconductor device CH1 mounted on the first redistribution substrate RD1. The first semiconductor device CH1 and the first redistribution substrate RD1 may be covered with a first mold layer MD1. A second redistribution substrate RD2 may be disposed on the first mold layer MD1. A conductive pillar MV1 may penetrate the first mold layer MD1 and may electrically connect the first redistribution substrate RD1 to the second redistribution substrate RD2. In this description, the term "redistribution substrate" may be called "redistribution layer" or "wiring structure."

The first redistribution substrate RD1 may include first, second, third, and fourth redistribution dielectric layers IL1 IL2, IL3, and IL4 that are sequentially stacked. The first, second, third, and fourth redistribution dielectric layers IL1 IL2, IL3, and IL4 may each include a photo-imagable dielectric (PID) layer. A redistribution bump 310 may be disposed in the first redistribution dielectric layer IL1. An external connection terminal 300 may be bonded to the redistribution bump 310. The external connection terminal 300 may be, e.g., one or more of a solder ball, a conductive bump, and a conductive pillar. The external connection terminal 300 may include, e.g., one or more of tin, lead, aluminum, gold, and nickel.

First, second, third, and fourth redistribution patterns RT1, RT2, RT3, and RT4 may be disposed between or in the first, second, third, and fourth redistribution dielectric layers IL1 IL2, IL3, and IL4. The first redistribution pattern RT1 may include a first via part V1 that penetrates the first redistribution dielectric layer IL1 and a first line part L1 between the first and second redistribution dielectric layers IL1 and IL2. The first via part V1 and the first line part L1 may be integrally formed into a single piece. The second redistribution pattern RT2 may include a second via part V2 that penetrates the second redistribution dielectric layer IL2 and a second line part L2 between the second and third redistribution dielectric layers IL2 and IL3. The second via part V2 and the second line part L2 may be integrally formed into a single piece. The third redistribution pattern RT3 may include a third via part V3 that penetrates the third redistribution dielectric layer IL3 and a third line part L3 between the third and fourth redistribution dielectric layers IL3 and IL4. The third via part V3 and the third line part L3 may be integrally formed into a single piece. The fourth redistribution pattern RT4 may include a fourth via part V4 that penetrates the fourth redistribution dielectric layer IL4 and a first substrate pad part 330 on the fourth redistribution dielectric layer IL4. The fourth via part V4 and the first substrate pad part 330 may be integrally formed into a single piece. The first to fourth via parts V1 to V4 may have inclined sidewalls. Each of the first to fourth via parts V1 to V4 may have a width which decreases in its downward direction. Each of the first to third line parts L1 to L3 may have line and pad shapes when viewed in a plan view. The first via part V1 may contact the redistribution bump 310.

The redistribution bump 310 and the first to fourth redistribution patterns RT1 to RT4 may include metal, e.g., copper, aluminum, tungsten, nickel, gold, tin, or titanium. The first to fourth via parts V1 to V4 may have their lateral and bottom surfaces each of which is covered with a barrier/seed layer, and the first to third line parts L1 to L3 may have their bottom surfaces each of which is covered with a barrier/seed layer. The barrier/seed layer may include a barrier layer and a seed layer that are sequentially stacked. The barrier layer may include a metal nitride layer. The seed layer may include the same metal as that of the first to fourth redistribution patterns RT1 to RT4.

The first semiconductor device CH1 may be a single semiconductor die, a single semiconductor chip, or a semiconductor package that includes a plurality of semiconductor dies of the same type or different types. For example, the first semiconductor device CH1 may be an image sensor chip, e.g., a complementary metal oxide semiconductor (CMOS) image sensor (CIS), a microelectromechanical system (MEMS) device chip, an application specific integrated circuit (ASIC) chip, and/or a memory device chip, e.g., a Flash memory, a dynamic random-access memory (DRAM), a static random-access memory (SRAM), an electrically erasable programmable read-only memory (EEPROM), a phase-change random-access memory (PRAM), a magnetoresistive random-access memory (MRAM), a resistive random-access memory (ReRAM), a high bandwidth memory (HBM), and a hybrid memory cubic (HMC).

The first semiconductor device CH1 may be flip-chip bonded through first internal connection members 335 to the first redistribution substrate RD1. The first internal connection members 335 may electrically connect the first substrate pad parts 330 to chip pads 322 of the first semiconductor device CH1. The first substrate pad part 330 may be called a first substrate conductive pad. The first internal connection members 335 may be one or more of, e.g., solder balls, conductive bumps, and conductive pillars. The first internal connection members 335 may include, e.g., one or more of tin, lead, silver, gold, and nickel.

The first mold layer MD1 may cover a sidewall and a top surface of the first semiconductor device CH1 and a top surface of the first redistribution substrate RD1. The first mold layer MD1 may include a dielectric resin, e.g., an epoxy molding compound (EMC). The first mold layer MD1 may further include fillers, and the fillers may be dispersed in the dielectric resin. For example, as illustrated in FIG. 2, the first mold layer MD1 may fill a space between the first semiconductor device CH1 and the first redistribution substrate RD1. In another example, an under-fill layer may be interposed between the first semiconductor device CH1 and the first redistribution substrate RD1.

The first mold layer MD1 may have a top surface (see MDU of FIG. 3A or 3B) that includes a redistribution area IR on which the second redistribution substrate RD2 is disposed and a marking area LR on which the second redistribution substrate RD2 is not disposed. For example, as illustrated in FIG. 1, the redistribution area IR may surround, e.g., an entire perimeter of, the marking area LR. For example, the second redistribution substrate RD2 may include a substrate opening OPT that exposes the top surface MDU of the first mold layer MD1. The second redistribution substrate RD2 may have a hollow closed "O" shape when viewed in a plan view, e.g., the second redistribution substrate RD2 may have a ring or a frame shape in a plan view. The substrate opening OPT may expose the marking area LR. For example, the marking area LR may be defined to indicate the top surface of the first mold layer MD1 exposed through the substrate opening OPT. The marking area LR may have a first width WT1 in a first direction X. The first width WT1 may range from about 10 mm to about 11 mm. The marking area LR may have a square or rectangular shape when viewed in a plan view.

Figure 3A:
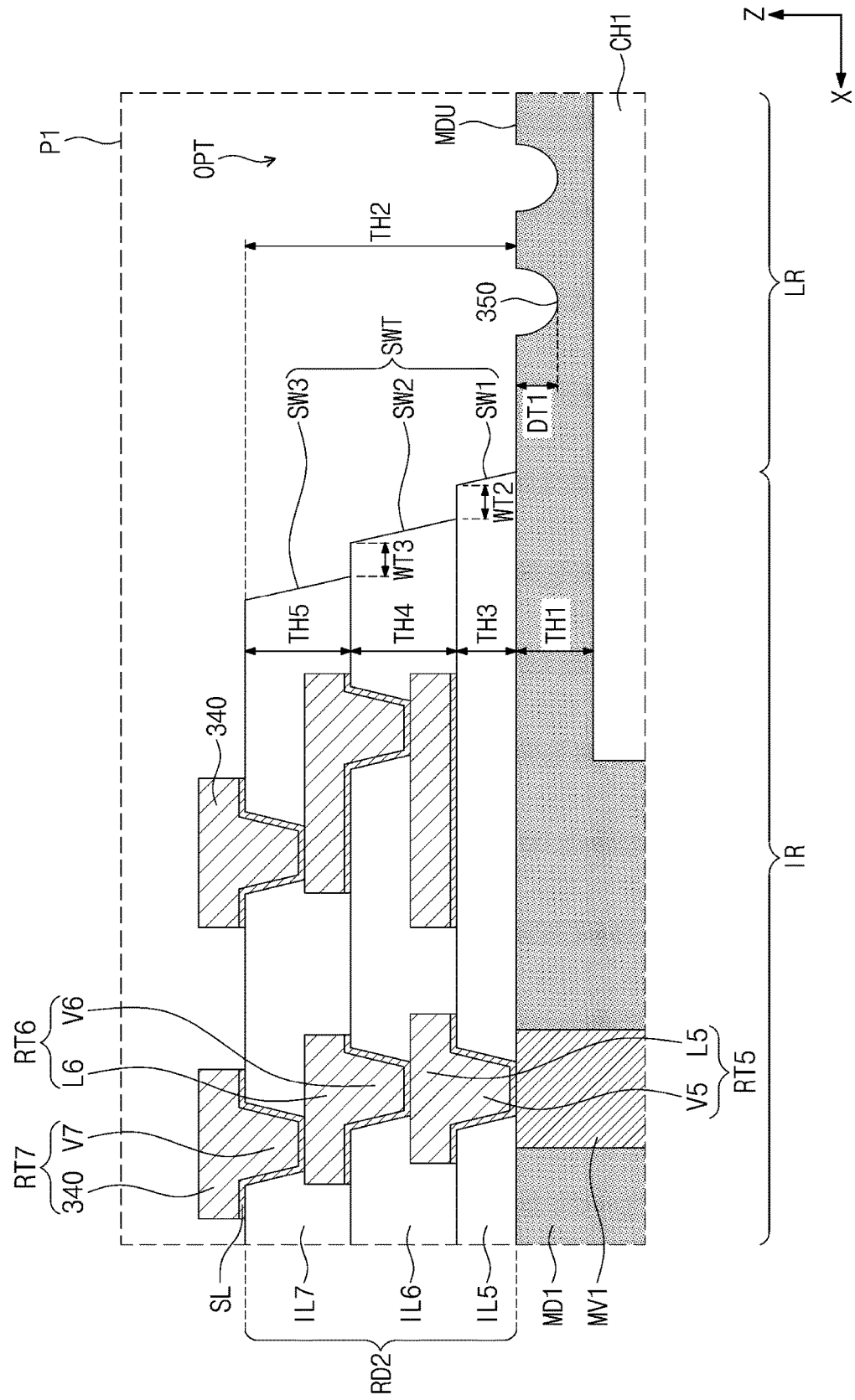
FIG. 3A illustrates an enlarged view of section P1 in FIG. 2, according to some embodiments.
Figure 3B:
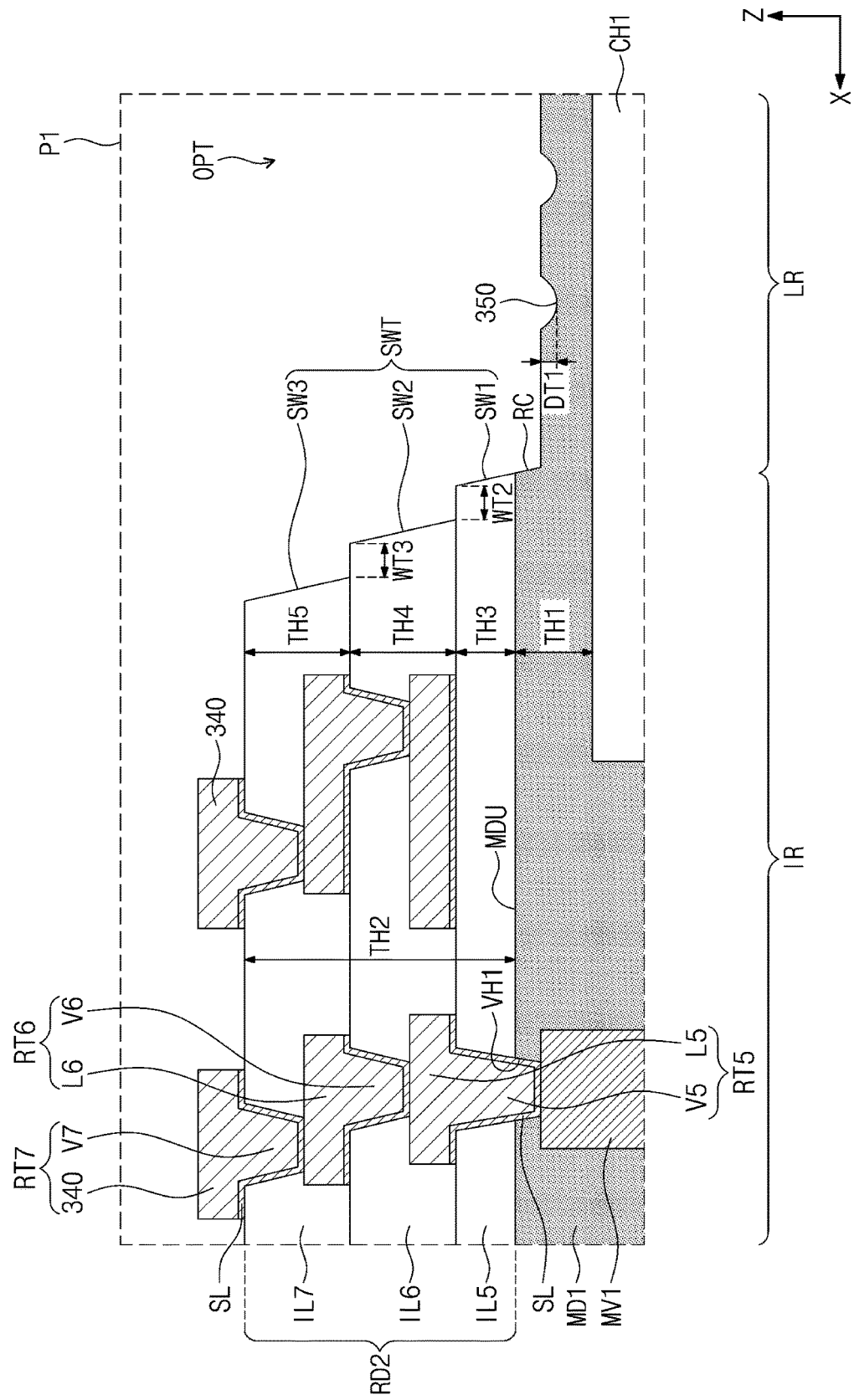
FIG. 3B illustrates an enlarged view of section P1 of FIG. 2, according to some other embodiments.

FIG. 3A illustrates an enlarged view showing section P1 of FIG. 2, according to some example embodiments, FIG. 3B illustrated an enlarged view showing section P1 of FIG. 2, according to some other example embodiments.

Referring to FIGS. 2 and 3A, either the substrate opening OPT or the marking area LR may vertically overlap the first semiconductor device CH1, e.g., the substrate opening OPT and the marking area LR may completely overlap each other vertically. A plurality of grooves 350 may be formed on the top surface MDU of the first mold layer MD1 in the marking area LR, e.g., the plurality of grooves 350 may be exposed through the substrate opening OPT to be visible from a top view. The grooves 350 may be formed or carved by a laser, and when viewed in a plan view, may display product information about the semiconductor package 1000. The grooves 350 may constitute a serial number, a bar code, a QR code, or the like. The grooves 350 may not expose the first semiconductor device CH1. The first mold layer MD1 may have a first thickness TH1, e.g., along the Z direction, on the first semiconductor device CH1. The first thickness TH1 may range, e.g., from about 30 µm to about 40 µm. The grooves 350 may have a third depth DT1 from the top surface MDU of the first mold layer MD1, e.g., along the Z direction. The first depth DT1 may be smaller than the first thickness TH1 and may range, e.g., from about 15 µm to about 20 µm.

The second redistribution substrate RD2 may have a second thickness TH2, e.g., along the Z direction. The second thickness TH2 may range, e.g., from about 20 µm to about 30 µm. The second redistribution substrate RD2 may include fifth, sixth, and seventh redistribution dielectric layers IL5, IL6, and IL7 that are sequentially stacked. The fifth, sixth, and seventh redistribution dielectric layers IL5, IL6, and IL7 may each include a photo-imagable dielectric (PID) layer. The first redistribution dielectric layer IL5 may have a third thickness TH3, e.g., along the Z direction. The sixth redistribution dielectric layer IL6 may have a fourth thickness TH4, e.g., along the Z direction. The seventh redistribution dielectric layer IL7 may have a fifth thickness TH5, e.g., along the Z direction. The third thickness TH3 may be less than each of the fourth thickness TH4 and the fifth thickness TH5. The fourth thickness TH4 may be substantially the same as the fifth thickness TH5 or may be about 0.9 times to about 1.1 times the fifth thickness TH5. For example, as illustrated in FIG. 3A, the second thickness TH2 may equal the sum of the third thickness TH3, the fourth thickness TH4, and the fifth thickness TH5.

The second redistribution substrate RD2 may have a stepwise shape at its substrate sidewall SWT exposed to the substrate opening OPT, e.g., the entire substrate sidewall SWT facing (e.g., defining) the opening may have a stepwise shape of multiple steps descending toward the top surface MDU of the first mold layer MD1. In detail, the fifth, sixth, and seventh redistribution dielectric layers IL5, IL6, and IL7 may have respective first, second, and third sidewalls SW1, SW2, and SW3, each of which faces the substrate opening OPT and is inclined, e.g., at an oblique angle. The first, second, and third sidewalls SW1, SW2, and SW3 of the fifth, sixth, and seventh redistribution dielectric layers IL5, IL6, and IL7 may be offset or spaced apart from each other in the first direction X, e.g., to define descending steps. For example, the second sidewall SW2 of the sixth redistribution dielectric layer IL6 may be spaced apart from the first sidewall SW1 of the fifth redistribution dielectric layer IL5 and may partially expose a top surface of the fifth redistribution dielectric layer IL5. The exposed top surface of the fifth redistribution dielectric layer IL5 may have a second width WT2 of about 1 µm to about 7 µm. The third sidewall SW3 of the seventh redistribution dielectric layer IL7 may be spaced apart from the second sidewall SW2 of the sixth redistribution dielectric layer IL6 and may partially expose a top surface of the sixth redistribution dielectric layer IL6. The exposed top surface of the sixth redistribution dielectric layer IL6 may have a third width WT3 of about 1 µm to about 7 µm. The second width WT2 may be substantially the same as or different from the third width WT3.

A fifth redistribution pattern RT5 may be disposed between the fifth and sixth redistribution dielectric layers IL5 and IL6. The fifth redistribution pattern RT5 may include a fifth via part V5 that penetrates the fifth redistribution dielectric layer IL5 and a fifth line part L5 between the fifth and sixth redistribution dielectric layers IL5 and IL6. The fifth via part V5 and the fifth line part L5 may be integrally formed into a single piece. The fifth via part V5 may be electrically connected to the conductive pillar MV1, e.g., a top surface of the conductive pillar MV1 may be coplanar with the top surface MDU of the first mold layer MD1.

A sixth redistribution pattern RT6 may be disposed between the sixth and seventh redistribution dielectric layers IL6 and IL7. The sixth redistribution pattern RT6 may include a sixth via part V6 that penetrates the sixth redistribution dielectric layer IL6 and a sixth line part L6 between the sixth and seventh redistribution dielectric layers IL6 and IL7. The sixth via part V6 and the sixth line part L6 may be integrally formed into a single piece.

A seventh redistribution pattern RT7 may be disposed on the seventh redistribution dielectric layer IL7. The seventh redistribution pattern RT7 may include a seventh via part V7 that penetrates the seventh redistribution dielectric layer IL7 and a second substrate pad part 340 on the seventh redistribution dielectric layer IL7. The seventh via part V7 and the second substrate pad part 340 may be integrally formed into a single piece.

The fifth to seventh via parts V5 to V7 may have their lateral and bottom surfaces each of which is covered with a barrier/seed layer SL, and the second substrate pad part 340 and the fifth and sixth line parts L5 and L6 may have their bottom surfaces each of which is covered with a barrier/seed layer SL. The second substrate pad part 340 may be called a second substrate conductive pad.

The fifth to seventh via parts V5 to V7 may have inclined sidewalls, e.g., inclined at an oblique angle. The fifth to seventh via parts V5 to V7 may have decreasing widths, each of which decreases in its downward direction. Each of the fifth and sixth line parts L5 and L6 may have line and pad shapes when viewed in a plan view.

The fifth to seventh redistribution patterns RT5 to RT7 may include metal, e.g., copper, aluminum, tungsten, nickel, gold, tin, or titanium. The barrier/seed layer SL may include a barrier layer and a seed layer that are sequentially stacked. The barrier layer may include a metal nitride layer.

Referring to FIG. 3B, the conductive pillar MV1 may have a top surface lower than the top surface MDU of the first mold layer MD1. The first mold layer MD1 may cover the top surface of the conductive pillar MV1. The fifth via part V5 may penetrate the fifth redistribution dielectric layer IL5 and a portion of the first mold layer MD1 to have an electrical connection with the conductive pillar MV1. A recess region RC may be formed on the top surface MDU of the first mold layer MD1, e.g., in the marking area LR. The recess region RC may have a bottom surface as high as or lower than the bottom surface of the fifth via part V5, e.g., relative to the bottom of the first redistribution substrate RD1. The recess region RC may have a sidewall aligned, e.g., level, with the first sidewall SW1 of the fifth redistribution dielectric layer IL5. The grooves 350 may be formed on the bottom surface of the recess region RC. The grooves 350 may have a first depth DT1 from the bottom surface of the recess region RC, e.g., long the Z direction. The first depth DT1 may range from about 15 μm to about 20 μm.

The semiconductor package 1000 may include the second redistribution substrate RD2 having the substrate opening OPT that exposes the marking area LR of the first mold layer MD1. The second redistribution substrate RD2 may have a stepwise structure at its substrate sidewall SWT, e.g., at a sidewall facing the marking area LR. In addition, the third thickness TH3 of the fifth redistribution dielectric layer IL5 may be relatively small at an edge of the second redistribution substrate RD2 exposed to the substrate opening OPT. Therefore, the first mold layer MD1 and the second redistribution substrate RD2 may be reduced or prevented from being delaminated due to a difference in thermal/physical characteristics between a material of the first mold layer MD1 and a material of the fifth redistribution dielectric layer IL5. Accordingly, increased reliability may be provided to the semiconductor package 1000 including the marking area LR.

FIGS. 4A to 4H illustrate cross-sectional views of stages in a method of fabricating the semiconductor package 1000 shown in FIG. 2. The cross-sections in FIGS. 4A-4H correspond to the portion illustrated in FIG. 3A.

Figure 4A:
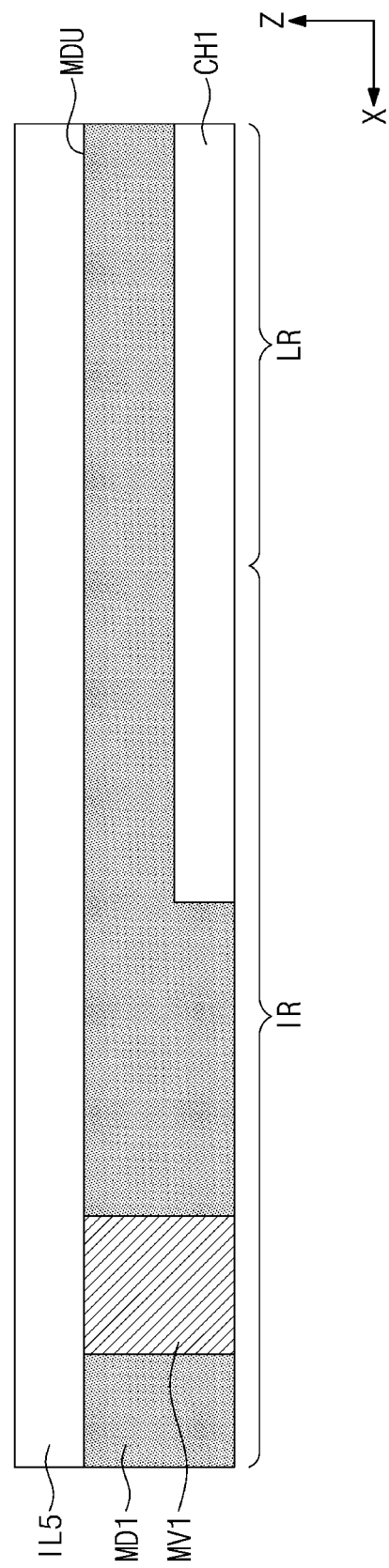
FIGS. 4A to 4H illustrate cross-sectional views of stages in a method of fabricating section P1, which is depicted in FIG. 3A.

Referring to FIGS. 2 and 4A, the first redistribution substrate RD1 may be manufactured, and then the conductive pillars MV1 may be bonded to the first redistribution substrate RD1. The first internal connection member 335 may be used to mount the first semiconductor device CH1 on the first redistribution substrate RD1. The first mold layer MD1 may be formed to cover the first semiconductor device CH1. For example, as illustrated in FIG. 2, the first mold layer MD1 may be formed to expose top surfaces of the conductive pillars MV1. In another example, as illustrated in FIG. 3B, the first mold layer MD1 may be formed to cover the top surfaces of the conductive pillars MV1. The fifth redistribution dielectric layer IL5 may be formed on the first mold layer MD1. The fifth redistribution dielectric layer IL5 may be formed of, e.g., a photo-imagable dielectric (PID) layer. The PID layer may be formed by, e.g., a coating process.

Figure 4B:
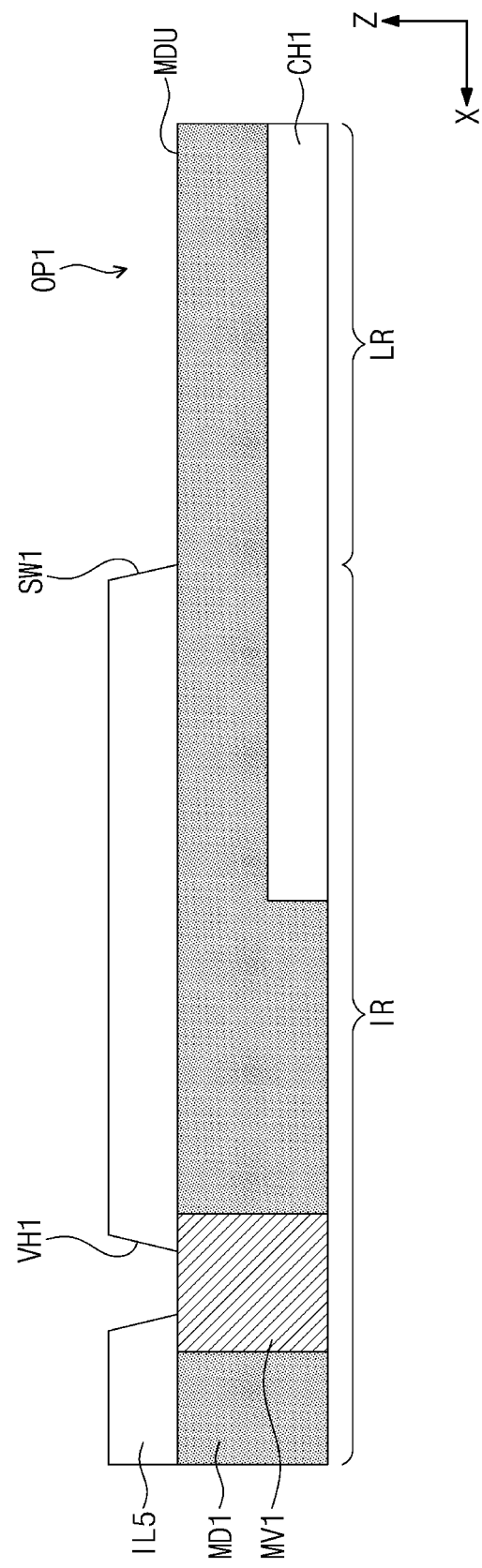

Referring to FIG. 4B, the fifth redistribution dielectric layer IL5 may undergo exposure, development, and curing processes to form a first via hole VH1 that exposes the conductive pillar MV1 and a first opening OP1 that exposes the top surface MDU of the first mold layer MD1 on the marking area LR. The fifth redistribution dielectric layer IL5 may have the first sidewall SW1 that limits, e.g., defines, the first opening OP1.

When the first mold layer MD1 is formed to cover the top surfaces of the conductive pillars MV1 as shown in FIG. 3B, the first mold layer MD1 may additionally undergo an isotropic/isotropic etching process in which the fifth redistribution dielectric layer IL5 is used as an etching mask. Therefore, the first via hole VH1 and the recess region RC may be formed as shown in FIG. 3B.

Figure 4C:
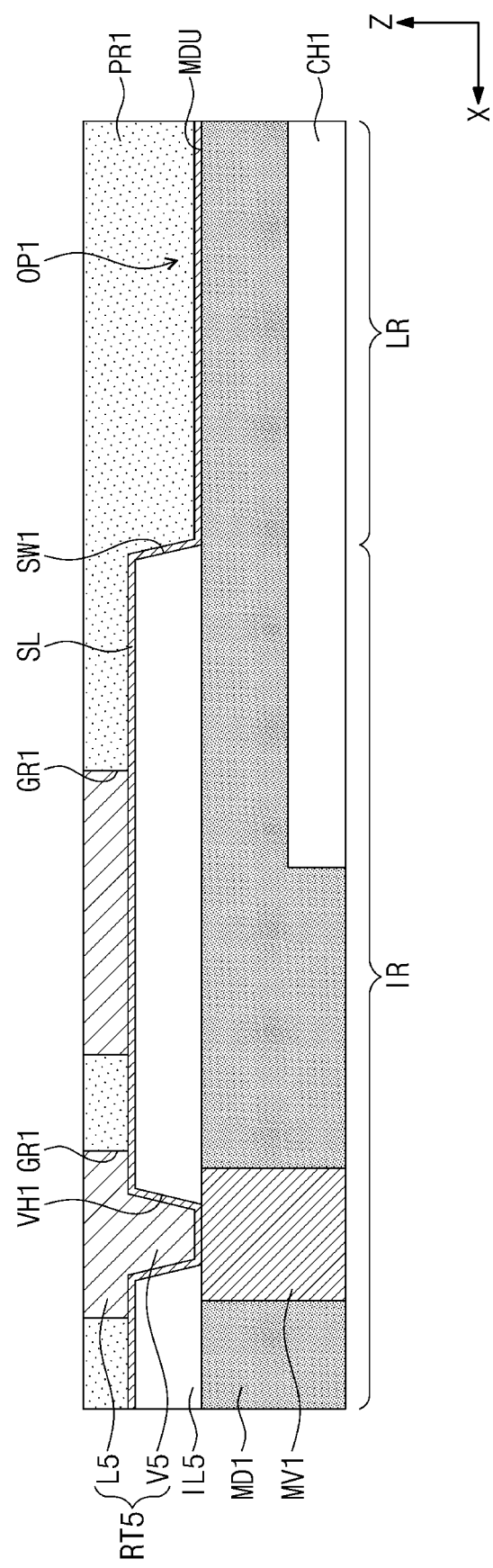

Referring to FIG. 4C, the barrier/seed layer SL may be conformally formed on an entire surface of the first mold layer MD1. A barrier layer and a seed layer may be sequentially stacked to form the barrier/seed layer SL. The barrier layer may be formed of at least one of, e.g., a titanium layer, a tantalum layer, a titanium nitride layer, and a tantalum nitride layer. The seed layer may be formed of a same metal layer as that of the fifth via part V5 which will be formed in a subsequent process. A photoresist layer PR1 may be coated on the barrier/seed layer SL. The photoresist layer PR1 may fill the first opening OP1. The photoresist layer PR1 may undergo exposure and development processes to expose the barrier/seed layer SL in the first via hole VH1 and to form a first groove GR1 that overlaps the barrier/seed layer SL.

An electroplating process may be performed to form on the barrier/seed layer SL a plating layer to fill the first via hole VH1 and the first groove GR1. The electroplating process may be supplied with a plating solution. The plating solution may include a suppressor that suppresses growth of the plating layer or movement of metal ions constituting the plating layer, an accelerator that serves as a catalyst for reducing reaction of metal ions constituting the plating layer to thereby increase a deposition rate of metals constituting the planting layer, and/or a leveler that is adsorbed on an electrode surface to reduce a current efficiency and a deposition rate and allows the plating layer to have a planarized top surface. Because the suppressor has a larger particle size, the suppressor may be difficult to enter the first via hole VH1 and the first groove GR1, which may have a narrow entrance. Thus, the suppressor may be relatively abundantly present mainly outside the first groove GR1. Because the accelerator has a smaller particle size, the accelerator may enter the first via hole VH1 and the first groove GR1, and thus, may be relatively abundantly present in the first via hole VH1 and the first groove GR1. Therefore, the plating layer may be easily deposited, e.g., formed, in the first via hole VH1 and the first groove GR1, i.e., where larger amounts of the accelerator are present, rather than outside the first via hole VH1 and the first groove GR1, i.e., where larger amounts of the suppressor are present.

Accordingly, as shown in FIG. 4C, the plating layer may be formed to fill the first via hole VH1 and the first groove GR1, but may almost not be deposited or may be deposited extremely thinly outside the first via hole VH1 and the first groove GR1. The plating layer may undergo polishing/etching processes to remove the plating layer on the photoresist layer PR1 and to expose the photoresist layer PR1. Accordingly, the fifth redistribution pattern RT5 may be formed. The fifth redistribution pattern RT5 may include the fifth via part V5 in the first via hole VH1 and the fifth line part L5 on the first via part V5.

Figure 4D:
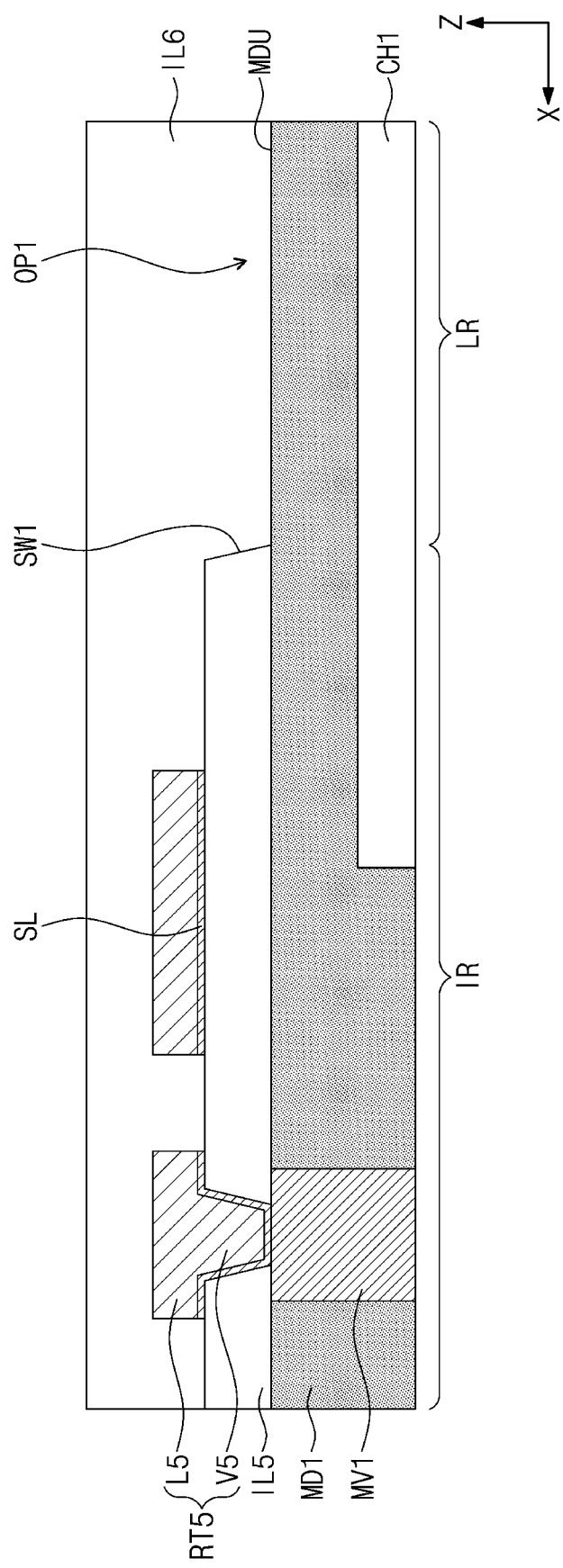

Referring to FIGS. 4C and 4D, the photoresist layer PR1 may be removed to expose a lateral surface of the fifth line part L5. The barrier/seed layer SL on a side of the fifth line part L5 may be removed to expose the top surface MDU of the first mold layer MD1 and also to expose a top surface and the first sidewall SW1 of the fifth redistribution dielectric layer IL5. The sixth redistribution dielectric layer IL6 may be formed on an entire surface of the first mold layer MD1. The sixth redistribution dielectric layer IL6 may be formed of, e.g., a photo-imagable dielectric (PID) layer. The PID layer may be formed by, e.g., a coating process. The sixth redistribution dielectric layer IL6 may fill the first opening OP1.

Figure 4E:
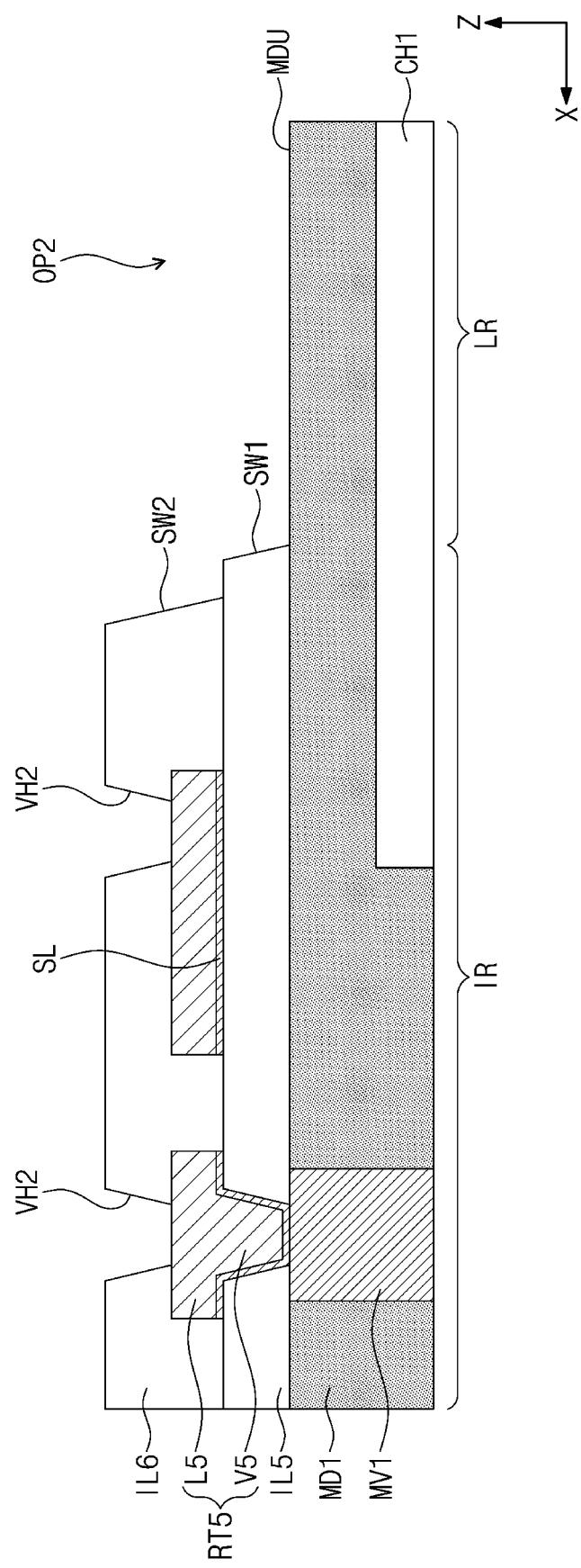

Referring to FIGS. 4D and 4E, the sixth redistribution dielectric layer IL6 may undergo exposure, development, and cure processes to form a second via hole VH2 that exposes the fifth redistribution pattern RT5 and a second opening OP2 that exposes the top surface MDU on the marking area LR of the first mold layer MD1. The sixth redistribution dielectric layer IL6 may have the second sidewall SW2 that limits, e.g., defines, the second opening OP2. The second opening OP2 may be formed to overlap the first opening OP1 and to have a width greater than that of the first opening OP1 in the first direction X, e.g., the first and second openings OP1 and OP2 may be concentric. Therefore, the second sidewall SW2 of the sixth redistribution dielectric layer IL6 may be formed to be spaced apart from the first sidewall SW1 of the fifth redistribution dielectric layer IL5, thereby partially exposing the top surface of the fifth redistribution dielectric layer IL5. For example, the second opening OP2 may partially expose the top surface of the fifth redistribution dielectric layer IL5.

Figure 4F:
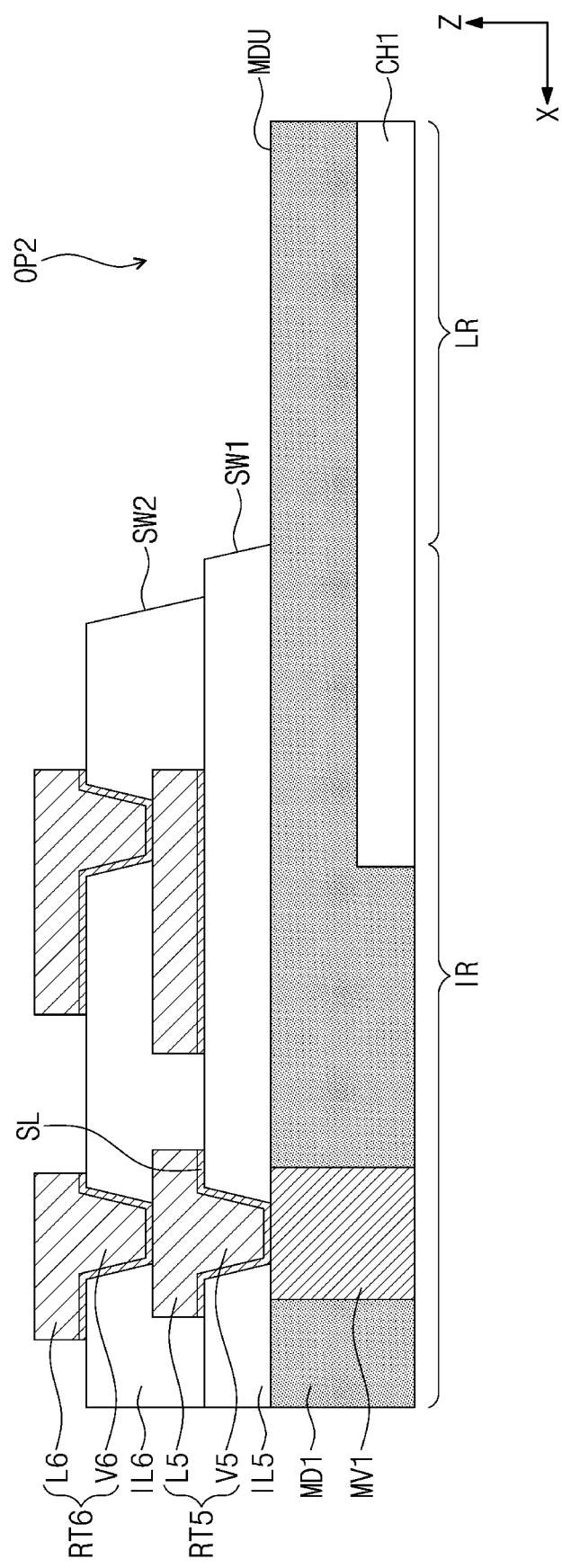

Referring to FIGS. 4E and 4F, the processes discussed with reference to FIG. 4C may be performed to form the sixth redistribution pattern RT6 on the sixth redistribution dielectric layer IL6. The sixth redistribution pattern RT6 may be formed to include the sixth via part V6 disposed in the second via hole VH2 and the sixth line part L6 on the sixth via part V6. A top surface of the sixth redistribution dielectric layer IL6 may be exposed.

Figure 4G:
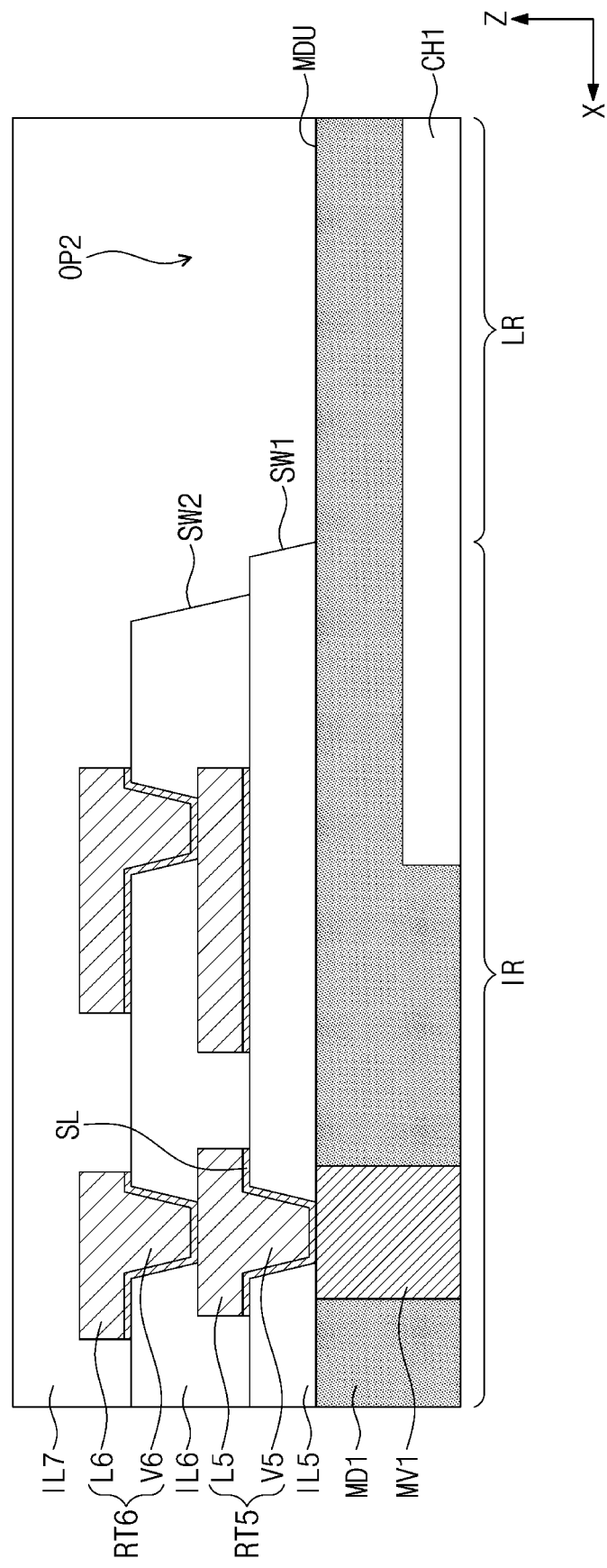

Referring to FIGS. 4F and 4G, the seventh redistribution dielectric layer IL7 may be formed on the sixth redistribution dielectric layer IL6. The seventh redistribution dielectric layer IL7 may be formed of, e.g., a photo-imagable dielectric (PID) layer. The PID layer may be formed by, e.g., a coating process. The seventh redistribution dielectric layer IL7 may fill the second opening OP2.

Figure 4H:
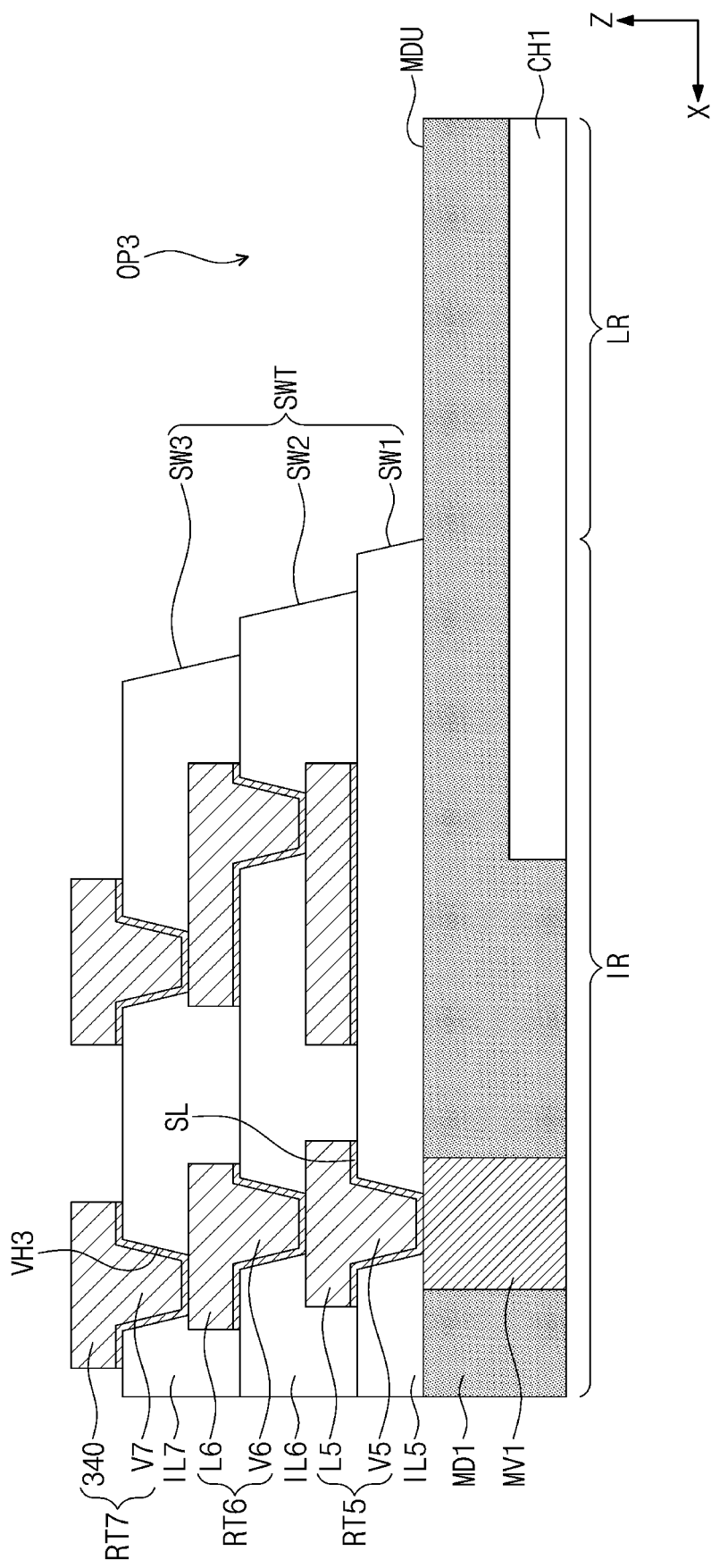

Referring to FIGS. 4G and 4H, the seventh redistribution dielectric layer IL7 may undergo exposure, development, and cure processes to form a third via hole VH3 that exposes the sixth redistribution pattern RT6 and a third opening OP3 that exposes the top surface MDU on the marking area LR of the first mold layer MD1. The seventh redistribution dielectric layer IL7 may have a third sidewall SW3 that limits, e.g., defines, the third opening OP3. The third opening OP3 may overlap the first and second openings OP1 and OP2, and may have a width greater than those of the first and second openings OP1 and OP2, e.g., the first through third openings OP1 through OP3 may be concentric. The third sidewall SW3 of the seventh redistribution dielectric layer IL7 may be spaced apart from the second sidewall SW2 of the sixth redistribution dielectric layer IL6 and may partially expose the top surface of the sixth redistribution dielectric layer IL6. For example, the third opening OP3 may partially expose the top surface of the sixth redistribution dielectric layer IL6. Therefore, the second redistribution substrate RD2 may have a stepwise shape at its substrate sidewall SWT that is constituted by the first to third sidewalls SW1 to SW3. The processes discussed with reference to FIG. 4C may be performed to form the seventh redistribution pattern RT7 on the seventh redistribution dielectric layer IL7. The seventh redistribution pattern RT7 may be formed to include the seventh via part V7 disposed in the third via hole VH3 and the second substrate pad part 340 on the seventh via part V7. A top surface of the seventh redistribution dielectric layer IL7 may be exposed.

Referring back to FIG. 3A, the plurality of grooves 350 may be formed by providing a laser to the top surface MDU of the first mold layer MD1 in the marking area LR. The plurality of grooves 350 may be visible, since the top surface MDU of the first mold layer MD1 in the marking area LR is exposed through the substrate opening OPT.

In a method of fabricating a semiconductor package according to some example embodiments, when each of the redistribution dielectric layers IL5 to IL7 undergoes exposure and developments processes, a corresponding one of the via holes VH1 to VH3 and a corresponding one of the openings OP1 to OP3 may be formed at the same time. Therefore, it may be possible to omit an etching procedure in which the redistribution dielectric layers IL5 to IL7 are etched to expose the marking area LR of the first mold layer MD1, and accordingly to simplify fabrication.

Figure 5:
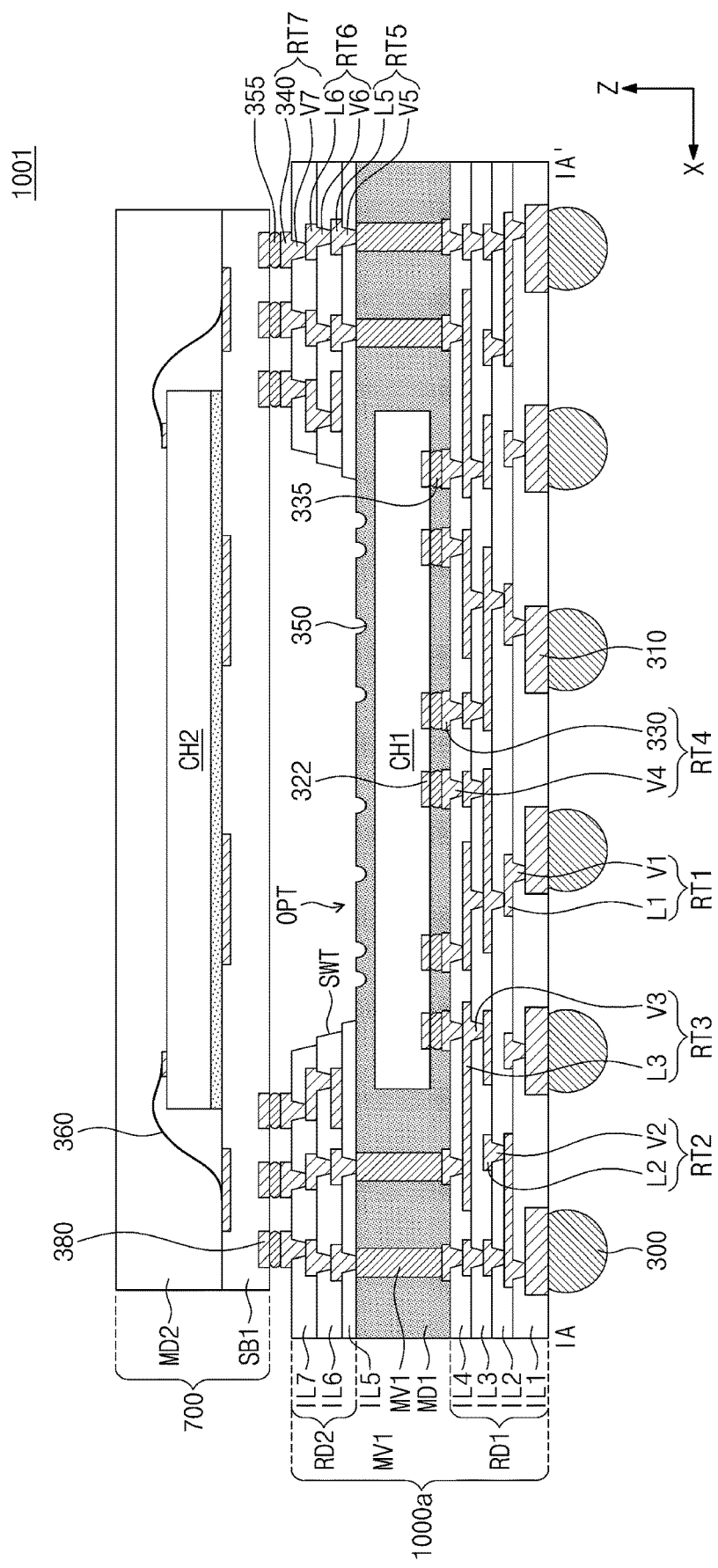
FIG. 5 illustrates a cross-sectional view taken along line IA-IA' of FIG. 1, according to some other example embodiments.

FIG. 5 illustrates a cross-sectional view taken along line IA-IA' of FIG. 1, according to some other embodiments.

Referring to FIG. 5, a semiconductor package 1001 according to the present embodiment may have a structure in which an upper semiconductor package 700 is mounted on a lower semiconductor package 1000a whose structure is the same as that of the semiconductor package 1000 shown in FIG. 2. The upper semiconductor package 700 may include an upper substrate SB1, a second semiconductor device CH2 mounted through a wire 360 on the upper substrate SB1, and a second mold layer MD2 that covers the second semiconductor device CH2. The upper substrate SB1 may be, e.g., a printed circuit board. The second semiconductor device CH2 may be a single semiconductor die, a single semiconductor chip, or a semiconductor package that includes a plurality of semiconductor dies. The upper semiconductor package 700 may be mounted through a second internal connection member 355 on the second redistribution substrate RD2. The second internal connection member 355 may connect a chip pad 380 of the upper substrate SB1 to the second substrate pad part 340 of the second redistribution substrate RD2. The substrate opening OPT of the second redistribution substrate RD2 may be positioned below the upper semiconductor package 700. Other configurations may be identical or similar to those discussed with reference to FIGS. 1 to 3B.

Figure 6:
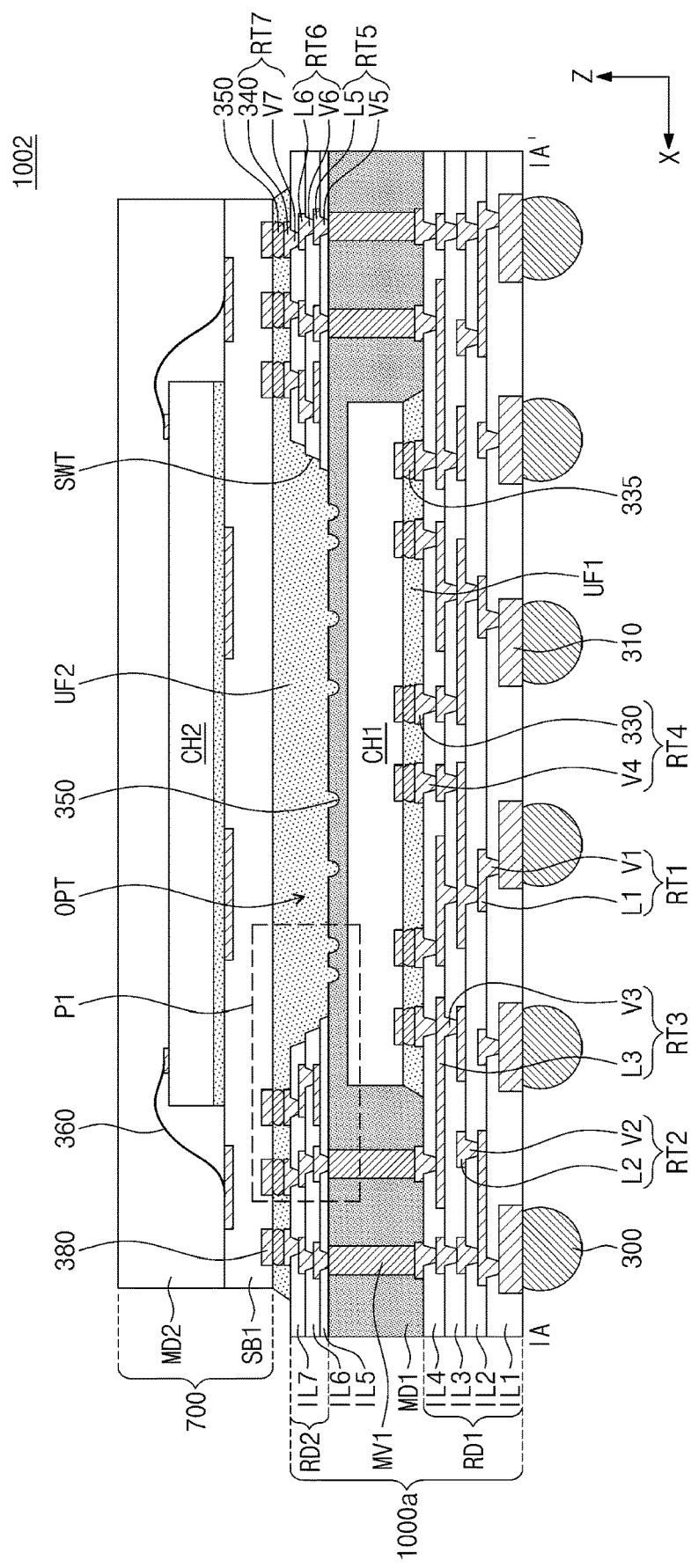
FIG. 6 illustrates a cross-sectional view taken along line IA-IA' of FIG. 1, according to some other example embodiments.
Figure 7:
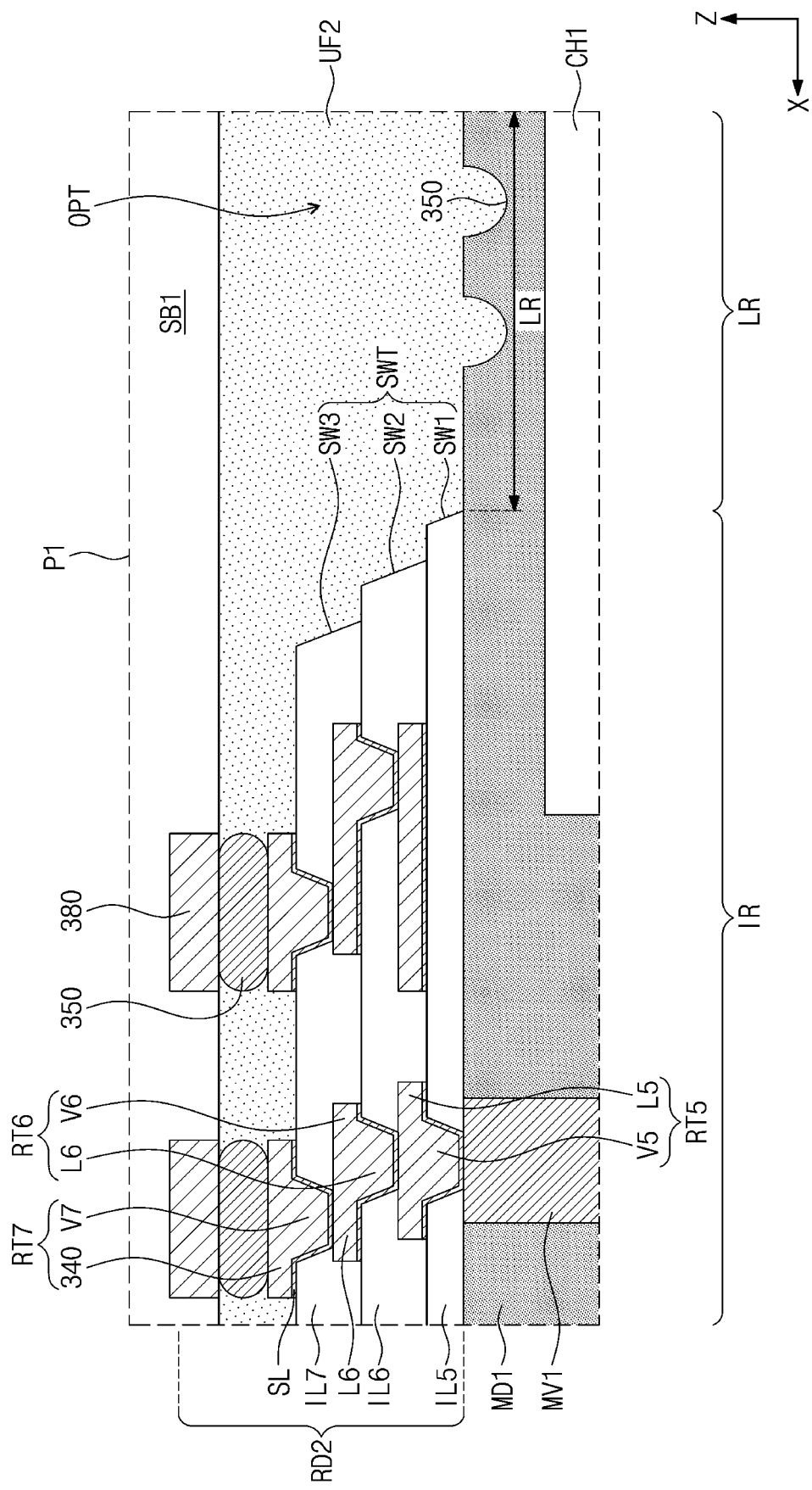
FIG. 7 illustrates an enlarged view showing section P1 of FIG. 6.

FIG. 6 illustrates a cross-sectional view taken along line IA-IA' of FIG. 1, according to some other embodiments. FIG. 7 illustrates an enlarged view showing section P1 of FIG. 6.

Referring to FIGS. 6 and 7, a semiconductor package 1002 according to the present embodiment may include the lower semiconductor package 1000a and the upper semiconductor package 700 that are sequentially stacked. The lower semiconductor package 1000a may be configured identically to the semiconductor package 1000 of FIG. 2, and a first under-fill layer UF1 may be interposed between the first semiconductor device CH1 and the first redistribution substrate RD1. In addition, a second under-fill layer UF2 may be interposed between the lower semiconductor package 1000a and the upper semiconductor package 700. The first and second under-fill layers UF1 and UF2 may include a thermo-curable resin layer or a photo-curable resin layer. The first and second under-fill layers UF1 and UF2 may further include organic or inorganic fillers distributed in the thermo-curable or photo-curable resin layer. The second under-fill layer UF2 may fill the substrate opening OPT. The second under-fill layer UF2 may also fill the grooves 350 formed on the marking area LR. Other configurations may be identical or similar to those discussed above with reference to FIG. 5.

Figure 8:
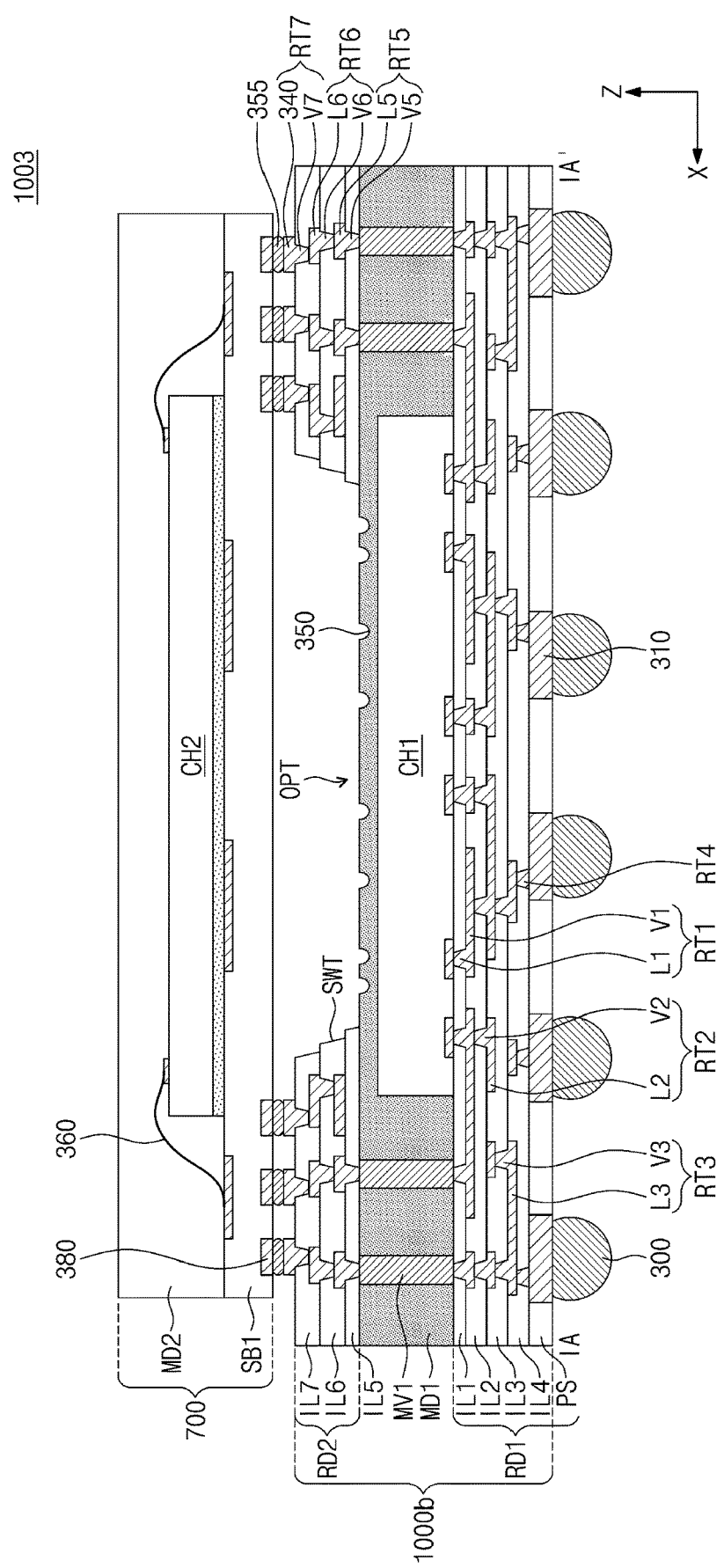
FIG. 8 illustrates a cross-sectional view taken along line IA-IA' of FIG. 1, according to some other example embodiments.

FIG. 8 illustrates a cross-sectional view taken along line IA-IA' of FIG. 1, according to some other embodiments.

Referring to FIG. 8, a semiconductor package 1003 according to the present embodiment may include a lower semiconductor package 1000b, in which the first redistribution substrate RD1 and the first semiconductor device CH1 are in contact with each other. The first redistribution substrate RD1 may include the first, second, third, and fourth redistribution dielectric layers IL1 IL2, IL3, and IL4 that are sequentially stacked from top to bottom. The first, second, third, and fourth redistribution patterns RT1, RT2, RT3, and RT4 may be disposed between or in the first, second, third, and fourth redistribution dielectric layers IL1 IL2, IL3, and IL4.

The first redistribution pattern RT1 may include the first via part V1 that penetrates the first redistribution dielectric layer IL1 and the first line part L1 between the first and second redistribution dielectric layers IL1 and IL2. The first via part V1 and the first line part L1 may be integrally formed into a single piece. The second redistribution pattern RT2 may include the second via part V2 that penetrates the second redistribution dielectric layer IL2 and a second line part L2 between the second and third redistribution dielectric layers IL2 and IL3. The second via part V2 and the second line part L2 may be integrally formed into a single piece. The third redistribution pattern RT3 may include the third via part V3 that penetrates the third redistribution dielectric layer IL3 and the third line part L3 between the third and fourth redistribution dielectric layers IL3 and IL4. The third via part V3 and the third line part L3 may be integrally formed into a single piece. The fourth redistribution pattern RT4 may penetrate the fourth redistribution dielectric layer IL4 and may have a via shape. A bottom surface of the fourth redistribution dielectric layer IL4 may be covered with a passivation layer PS. The redistribution bump 310 may be positioned in the passivation layer PS. The passivation layer PS may include a photo-imagable dielectric (PID) layer.

Each of the first to fourth via parts V1 to V4 may have a width that increases in its downward direction. One of the first via parts V1 may contact the chip pad 322 of the first semiconductor device CH1. The conductive pillar MV1 may contact another of the first via parts V1. Other configurations may be identical or similar to those discussed above with reference to FIG. 5.

Figure 9:
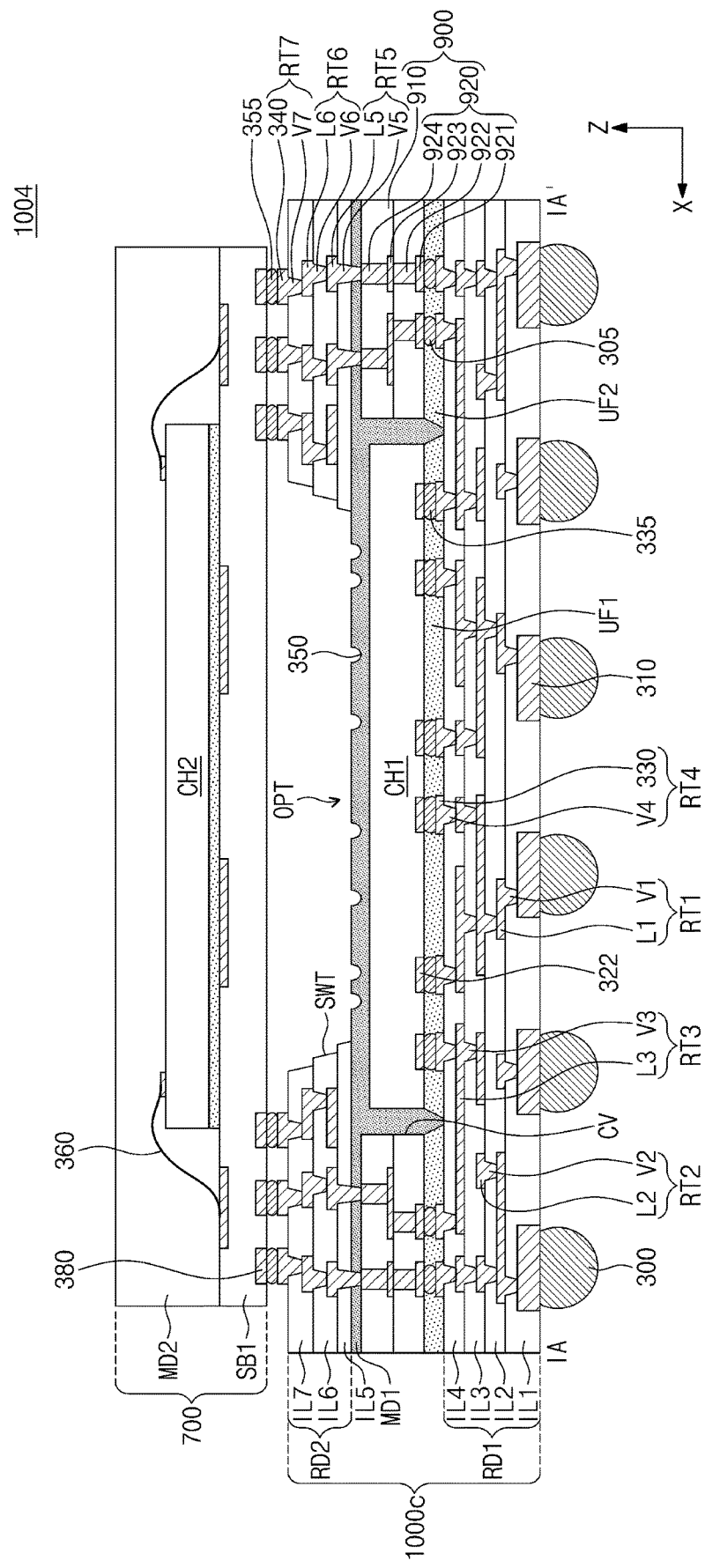
FIG. 9 illustrates a cross-sectional view taken along line IA-IA' of FIG. 1, according to some other example embodiments.

FIG. 9 illustrates a cross-sectional view taken along line IA-IA' of FIG. 1, according to some other embodiments.

Referring to FIG. 9, a semiconductor package 1004 according to the present embodiment may include a lower semiconductor package 1000c including the first redistribution substrate RD1, a connection substrate 900 and the first semiconductor device CH1 that are mounted on the first redistribution substrate RD1, the first mold layer MD1 that covers the connection substrate 900 and the first semiconductor device CH1, and the second redistribution substrate RD2 on the first mold layer MD1.

The first under-fill layer UF1 may be interposed between the first semiconductor device CH1 and the first redistribution substrate RD1. The connection substrate 900 may include a cavity region CV at a center thereof. The first semiconductor device CH1 may be disposed in the cavity region CV. The connection substrate 900 may include a plurality of base layers 910 and a conductive structure 920. The base layers 910 may include a dielectric material. For example, the base layers 910 may include a carbon-based material, a ceramic, or a polymer. The conductive structure 920 may include a connection pad 921, a first connection via 922, a connection line 923, and a second connection via 924.

The connection substrate 900 may be connected through a fourth internal connection member 305 to the first redistribution substrate RD1. A second under-fill layer UF2 may be interposed between the connection substrate 900 and the first redistribution substrate RD1. The first mold layer MD1 may fill a space between the first semiconductor device CH1 and an inner wall of the cavity region CV of the connection substrate 900.

A fifth via part V5 of the second redistribution substrate RD2 may penetrate a fifth redistribution dielectric layer IL5 and the first mold layer MD1, thereby contacting the second connection via 924. Other configurations may be identical or similar to those discussed above with reference to FIG. 5.

Figure 10:
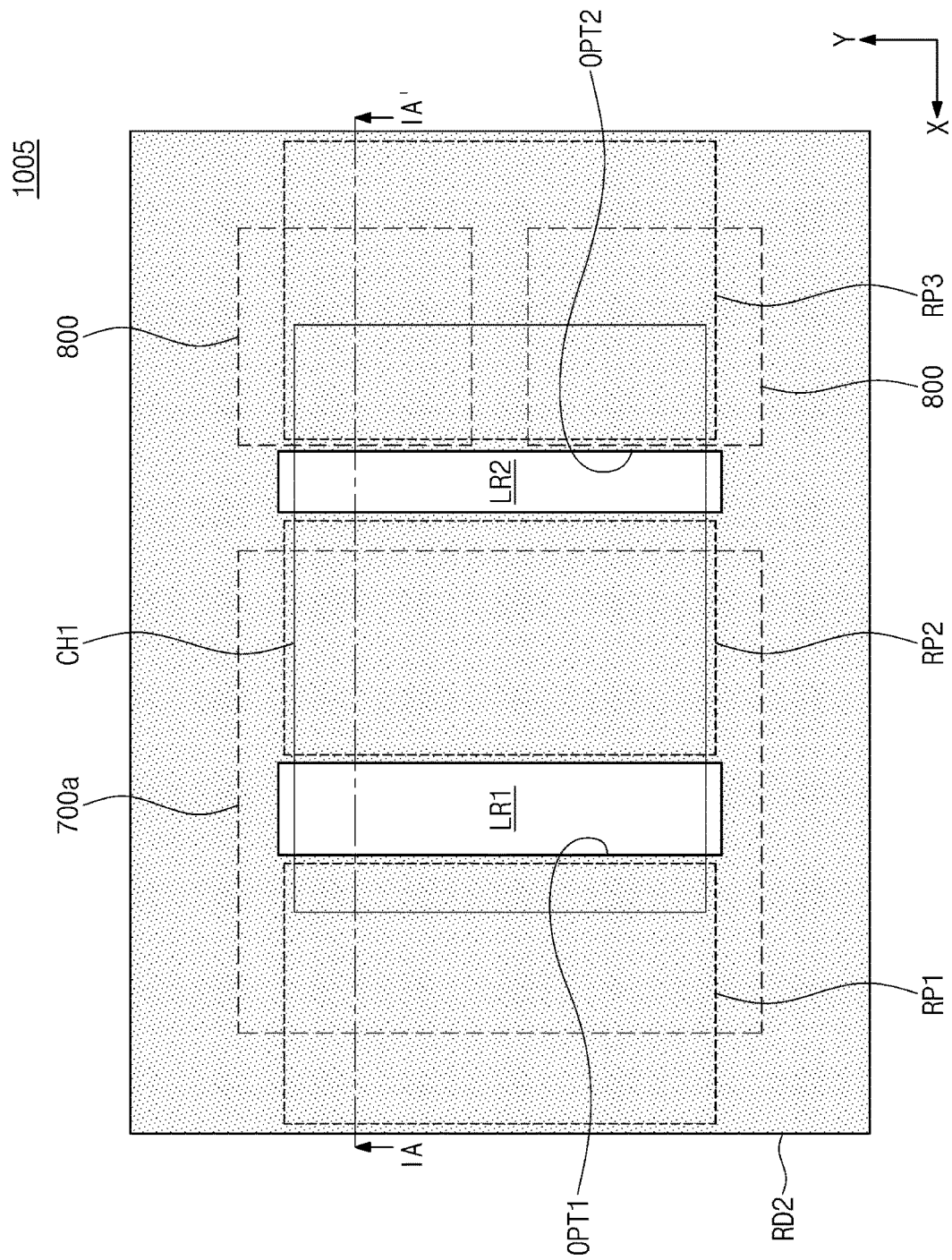
FIG. 10 illustrates a plan view of a semiconductor package according to some example embodiments.
Figure 11:
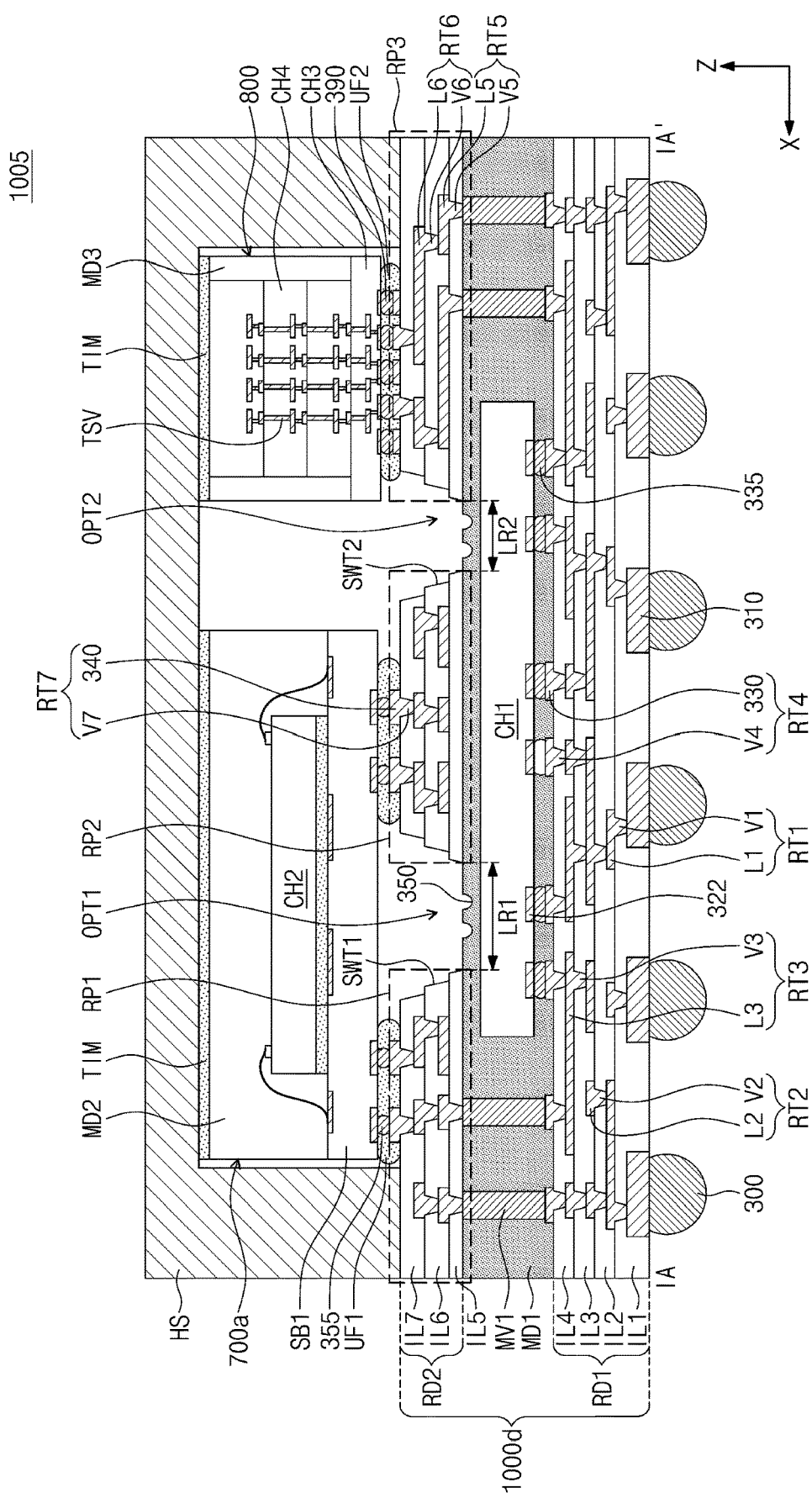
FIG. 11 illustrates a cross-sectional view taken along line IA-IA' of FIG. 10.

FIG. 10 illustrates a plan view showing a semiconductor package according to some example embodiments. FIG. 11 illustrates a cross-sectional view taken along line IA-IA' of FIG. 10.

Referring to FIGS. 10 and 11, a semiconductor package 1005 according to the present embodiment may include a lower semiconductor package 1000d, a first upper semiconductor package 700a mounted on the lower semiconductor package 1000d, and second upper semiconductor packages 800 mounted on the lower semiconductor package 1000d and side by side in the first direction X with the first upper semiconductor package 700a. The second upper semiconductor packages 800 may be spaced apart from each other in a second direction Y that intersects the first direction X. The first upper semiconductor package 700a and the second upper semiconductor packages 800 may be covered with a thermal radiation member HS. The thermal radiation member HS may include a material with high thermal conductivity, e.g., metal or graphene.

The first upper semiconductor package 700a may be the same as or similar to the upper semiconductor package 700 discussed with reference to FIG. 5. The second upper semiconductor package 800 may include a plurality of second semiconductor dies CH4 stacked on a first semiconductor die CH3. Each of the first and second semiconductor dies CH3 and CH4 may include a through via TSV. The second semiconductor dies CH4 may have their sidewalls covered with a third mold layer MD3. The second upper semiconductor package 800 may be a high bandwidth memory (HBM) chip.

A thermal interface material layer TIM may be interposed between the thermal radiation member HS and the first upper semiconductor package 700a, and between the thermal radiation member HS and the second upper semiconductor package 800. The thermal interface material layer TIM may include a grease or a thermo-curable resin layer. The thermal interface material layer TIM may further include filler particles distributed in the thermo-curable resin layer. For example, the filler particles may include a graphene power or a metal power having high thermal conductivity. In another example, the filler particles may include one or more of silica, alumina, zinc oxide, and boron nitride.

The lower semiconductor package 1000d may include the first redistribution substrate RD1, the first semiconductor device CH1 mounted on the first redistribution substrate RD1, the first mold layer MD1 that covers the first semiconductor device CH1, and the second redistribution substrate RD2 on the first mold layer MD1. The second redistribution substrate RD2 may include a first substrate opening OPT1 and a second substrate opening OPT2 that are spaced apart from each other in the first direction X. When viewed in a plan view, each of the first and second substrate openings OPT1 and OPT2 may have, e.g., a rectangular shape that is elongated in the second direction Y. The second redistribution substrate RD2 may have a first substrate sidewall SWT1 that limits, e.g., bounds or defines, the first substrate opening OPT1 and a second substrate sidewall SWT2 that limits, e.g., surrounds, the second substrate opening OPT2. Each of the first and second substrate sidewalls SWT1 and SWT2 may have a stepwise shape. The second redistribution substrate RD2 may include a first substrate part RP1 that overlaps the thermal radiation member HS and a portion of the first upper semiconductor package 700a, a second substrate part RP2 between the first substrate opening OPT1 and the second substrate opening OPT2, and a third substrate part RP3 that overlaps the second upper semiconductor package 800 and the thermal radiation member HS.

The first mold layer MD1 may include a first marking area LR1 exposed to the first substrate opening OPT1 and a second marking area LR2 exposed to the second substrate opening OPT2. On the first and second marking areas LR1 and LR2, the plurality of grooves 350 may be formed on a top surface of the first mold layer MD1.

The first upper semiconductor package 700a may be electrically connected through second internal connection members 355 to second substrate conductive pads 240 on the first and second substrate parts RP1 and RP2. The first under-fill layer UF1 may be interposed between the first upper semiconductor package 700a and the first substrate part RP1 and between the first upper semiconductor package 700a and the second substrate part RP2.

The second upper semiconductor package 800 may be electrically connected through a third internal connection member 390 to a second substrate pad part 340 on the third substrate part RP3. The second under-fill layer UF2 may be interposed between the second upper semiconductor package 800 and the third substrate part RP3. Other configurations may be identical or similar to those discussed above with reference to FIG. 5.

By way of summation and review, example embodiments provide a semiconductor package with increased reliability. Example embodiments also provide a method of fabricating the semiconductor package by simplified processes.

That is, a semiconductor package according to embodiments may include a second redistribution substrate having an opening that exposes a marking area of a mold layer. The second redistribution substrate may have a stepwise structure at a substrate sidewall thereof. In addition, a fifth redistribution dielectric layer at bottom of the second redistribution substrate may have a relatively small thickness. Therefore, a delamination phenomenon may be reduced or prevented between the mold layer and the second redistribution substrate. As a result, the semiconductor package may increase in reliability.

In the method of fabricating the semiconductor package according to embodiments, when exposure and development processes are performed on redistribution dielectric layers of the second redistribution substrate, via holes and openings to which the marking area is exposed may be formed at the same time. Therefore, an additional, i.e., separate, etching process is not required in the redistribution dielectric layers to expose the marking area of the mold layer. Accordingly, a simplified fabrication may be accomplished.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a first semiconductor device on a first redistribution substrate;
   a first mold layer that covers the first semiconductor device and the first redistribution substrate; and
   a second redistribution substrate on the first mold layer, the second redistribution substrate including:
   a first opening that exposes a top surface of the first mold layer, a sidewall of the second redistribution substrate that is exposed to the first opening having a stepwise structure, and
   a first redistribution dielectric layer and a second redistribution dielectric layer that are sequentially stacked, sidewalls of the first and second redistribution dielectric layers being offset from each other to form the stepwise structure, and an offset distance between the sidewalls of the first and second redistribution dielectric layers being smaller than a first thickness of the first redistribution dielectric layer and smaller than a second thickness of the second redistribution dielectric layer,
   wherein the first mold layer includes grooves on the top surface of the first mold layer, the grooves being spaced apart from a top surface of the first semiconductor device.

2. A semiconductor package, comprising:
   a first semiconductor device on a first redistribution substrate;
   a first mold layer that covers the first semiconductor device and the first redistribution substrate; and
   a second redistribution substrate on the first mold layer, the second redistribution substrate having a first opening that exposes a top surface of the first mold layer,
   wherein the second redistribution substrate includes:
   a first redistribution dielectric layer and a second redistribution dielectric layer that are sequentially stacked, and
   first redistribution patterns between the first redistribution dielectric layer and the second redistribution dielectric layer, all the first redistribution patterns being internal within the second redistribution substrate, and
   wherein a thickness of the first redistribution dielectric layer is less than a thickness of the second redistribution dielectric layer, the first redistribution dielectric layer being between the first mold layer and the second redistribution dielectric layer.

3. The semiconductor package as claimed in claim 1, wherein the first thickness is less than the second thickness.

4. The semiconductor package as claimed in claim 1, wherein an exposed top surface of the first redistribution dielectric layer has a width of about 1 μm to about 7 μm, the width of the exposed top surface of the first redistribution dielectric layer being equal to the offset distance between the sidewalls of the first and second redistribution dielectric layers and being exposed without being covered with the second redistribution dielectric layer.

5. The semiconductor package as claimed in claim 1, wherein:
   the grooves have a depth of about 15 μm to about 20 μm from the top surface of the first mold layer, and
   a thickness of the first mold layer on the first semiconductor device is about 30 μm to about 40 μm.

6. The semiconductor package as claimed in claim 1, further comprising:
   an upper semiconductor package on the second redistribution substrate; and
   an under-fill layer between the upper semiconductor package and the second redistribution substrate, the under-fill layer filling the first opening.

7. The semiconductor package as claimed in claim 6, wherein the first mold layer includes grooves on the top surface of the first mold layer, the under-fill layer filling the grooves.

8. The semiconductor package as claimed in claim 1, wherein the second redistribution substrate further includes at least one second opening spaced apart from the first opening.

9. The semiconductor package as claimed in claim 1, further comprising a connection substrate on the first redistribution substrate, the connection substrate including a cavity region into which the first semiconductor device is inserted,
wherein the first mold layer fills a space between the first semiconductor device and the connection substrate, and between the second redistribution substrate and the connection substrate,
wherein the second redistribution substrate includes
a first redistribution pattern between the first redistribution dielectric layer and the second redistribution dielectric layer, and
wherein a portion of the first redistribution pattern penetrates the first redistribution dielectric layer and the first mold layer to electrically connect with the connection substrate.

10. A semiconductor package, comprising:
a first semiconductor device on a first redistribution substrate;
a first mold layer that covers the first semiconductor device and the first redistribution substrate;
a second redistribution substrate on the first mold layer, the second redistribution substrate including:
a first opening that exposes a top surface of the first mold layer, and the second redistribution substrate having a thickness of about 20 μm to about 30 μm; and
a conductive pillar that penetrates the first mold layer and electrically connects the first redistribution substrate to the second redistribution substrate,
wherein the second redistribution substrate includes:
a first redistribution dielectric layer that contacts the first mold layer and has a first sidewall,
a second redistribution dielectric layer on the first redistribution dielectric layer, the second redistribution dielectric layer having a second sidewall spaced apart from the first sidewall, the second redistribution dielectric layer partially exposing a top surface of the first redistribution dielectric layer, and a distance between the first sidewall and the second sidewall being smaller than a first thickness of the first redistribution dielectric layer and smaller than a second thickness of the second redistribution dielectric layer, and
a first redistribution pattern between the first redistribution dielectric layer and the second redistribution dielectric layer, the first redistribution pattern penetrating the first redistribution dielectric layer and contacting the conductive pillar, and
wherein the first mold layer includes grooves on the top surface of the first mold layer, the grooves being spaced apart from a top surface of the first semiconductor device.

11. The semiconductor package as claimed in claim 10, wherein the first thickness is less than the second thickness.

12. The semiconductor package as claimed in claim 10, further comprising:
an upper semiconductor package on the second redistribution substrate; and
an under-fill layer between the upper semiconductor package and the second redistribution substrate, the under-fill layer filling the first opening.

13. The semiconductor package as claimed in claim 10, wherein the second redistribution substrate further includes at least one second opening spaced apart from the first opening.

14. The semiconductor package as claimed in claim 10, wherein:
a top surface of the conductive pillar is lower than the top surface of the first mold layer,
the first redistribution pattern penetrates the first mold layer to connect with the conductive pillar, and
the first mold layer includes a recess region exposed to the first opening.

15. The semiconductor package as claimed in claim 14, wherein a sidewall of the recess region is aligned with the first sidewall of the first redistribution dielectric layer.

16. The semiconductor package as claimed in claim 2, wherein:
sidewalls of the first and second redistribution dielectric layers are offset from each other to form the stepwise structure, and
an offset distance between the sidewalls of the first and second redistribution dielectric layers being smaller than a thickness of each one of the first and second redistribution dielectric layers.

17. The semiconductor package as claimed in claim 2, wherein the first mold layer includes grooves on the top surface of the first mold layer, the grooves being spaced apart from a top surface of the first semiconductor device.

18. The semiconductor package as claimed in claim 2, further comprising:
an upper semiconductor package on the second redistribution substrate; and
an under-fill layer between the upper semiconductor package and the second redistribution substrate, the under-fill layer filling the first opening.

* * * * *